United States Patent
Ishaaya et al.

(10) Patent No.: US 7,555,024 B2
(45) Date of Patent: Jun. 30, 2009

(54) RESONATOR CAVITY CONFIGURATION AND METHOD

(75) Inventors: Amiel A. Ishaaya, Nes Ziona (IL); Nir Davidson, Rishon le Zion (IL); Asher A. Friesem, Rehovot (IL); Liran Shimshi, Tel Aviv (IL)

(73) Assignee: Yeda Research and Development Company Ltd., Rehovot (IL)

( * ) Notice: Subject to any disclaimer, the term of this patent is extended or adjusted under 35 U.S.C. 154(b) by 41 days.

(21) Appl. No.: 10/583,125

(22) PCT Filed: Dec. 16, 2004

(86) PCT No.: PCT/IL2004/001141

§ 371 (c)(1),
(2), (4) Date: Jun. 16, 2006

(87) PCT Pub. No.: WO2005/060052

PCT Pub. Date: Jun. 30, 2005

(65) Prior Publication Data

US 2007/0147445 A1    Jun. 28, 2007

Related U.S. Application Data

(60) Provisional application No. 60/530,259, filed on Dec. 18, 2003.

(51) Int. Cl.
*H01S 3/13* (2006.01)
*H01S 3/08* (2006.01)

(52) U.S. Cl. .................. 372/29.023; 372/92; 372/101

(58) Field of Classification Search ............ 372/29.023, 372/92, 101
See application file for complete search history.

(56) References Cited

U.S. PATENT DOCUMENTS 3,414,840 A    12/1968    Domenico, Jr. et al.
3,437,955 A    4/1969    Enloe et al.

(Continued)

FOREIGN PATENT DOCUMENTS

EP    0 982 620 A2    3/2000

OTHER PUBLICATIONS

Ishaaya et al., "Intracavity Coherent Addition of Gaussian Beam Distributions Using a Planar Interferometric Coupler." *Applied Physics Letters*, v. 85:12, pp. 2187-2189, 2004.

(Continued)

*Primary Examiner*—Armando Rodriguez
(74) *Attorney, Agent, or Firm*—The Nath Law Group; Jerald L. Meyer; Sungyeop Chung

(57) ABSTRACT

A resonator cavity (10A) and method and presented. The resonator cavity (10A) comprises at least one gain medium (16) and end reflectors (12, 14) which define together longitudinal modes of light in the cavity, and further comprises an intra-cavity beam coupler assembly (20). The beam coupler assembly (20) is configured to split light impinging thereon into a predetermined number of spatially separated light channels, and to cause phase locking and at least partial coherent combining of the light channels, having common longitudinal and transverse modes, in a double pass through the beam coupler assembly (20). The resonator cavity (10A) is configured and operable to produce at least one output combined light channel of a predetermined intensity profile.

30 Claims, 10 Drawing Sheets

U.S. PATENT DOCUMENTS

| | | | |
|---|---|---|---|
| 3,453,559 A | 7/1969 | Sharp et al. |
| 3,496,487 A | 2/1970 | Soffer et al. |
| 3,526,852 A | 9/1970 | Kaplan |
| 3,539,940 A | 11/1970 | Miller |
| 3,575,670 A | 4/1971 | Hansen |
| 3,699,474 A | 10/1972 | Landry |
| 3,877,813 A | 4/1975 | Hayes et al. |
| 4,096,448 A | 6/1978 | Hayes |
| 4,170,405 A | 10/1979 | Sziklas |
| 4,385,389 A | 5/1983 | Botez |
| 4,547,396 A | 10/1985 | Botez et al. |
| 4,594,719 A | 6/1986 | Ackley |
| 4,624,000 A | 11/1986 | Streifer et al. |
| 4,641,311 A | 2/1987 | Ackley |
| 4,648,092 A | 3/1987 | Ewbank et al. |
| 4,649,351 A | 3/1987 | Veldkamp et al. |
| 4,661,962 A | 4/1987 | Clayton |
| 4,674,096 A | 6/1987 | Salzman et al. |
| 4,682,339 A | 7/1987 | Sziklas et al. |
| 4,688,884 A | 8/1987 | Scifres et al. |
| 4,719,635 A | 1/1988 | Yeh |
| 4,723,252 A | 2/1988 | Botez et al. |
| 4,757,268 A | 7/1988 | Abrams et al. |
| 4,761,059 A | 8/1988 | Yeh et al. |
| 4,791,650 A | 12/1988 | Tatsuno et al. |
| 4,794,345 A | 12/1988 | Linford et al. |
| 4,796,269 A | 1/1989 | DeFreez et al. |
| 4,799,223 A | 1/1989 | Streifer et al. |
| 4,831,630 A | 5/1989 | Scifres et al. |
| 4,833,683 A | 5/1989 | Ury et al. |
| 4,860,298 A | 8/1989 | Botez et al. |
| 4,878,724 A | 11/1989 | Thaniyavarn |
| 4,879,721 A | 11/1989 | Braski et al. |
| 4,904,068 A | 2/1990 | Tatsuno et al. |
| 4,933,649 A | 6/1990 | Swanson et al. |
| 4,982,166 A | 1/1991 | Morrow |
| 4,985,897 A | 1/1991 | Botez et al. |
| 5,014,061 A | 5/1991 | Ghose |
| 5,023,882 A | 6/1991 | Paoli |
| 5,033,060 A | 7/1991 | Leger et al. |
| 5,050,173 A | 9/1991 | Hughes |
| 5,050,180 A | 9/1991 | Botez et al. |
| 5,058,121 A | 10/1991 | Paoli |
| 5,084,882 A | 1/1992 | Hughes |
| 5,121,400 A | 6/1992 | Verdiell et al. |
| 5,276,758 A | 1/1994 | Hughes |
| 5,323,405 A | 6/1994 | Kamiyama et al. |
| 5,373,526 A | 12/1994 | Lam et al. |
| 5,410,625 A | 4/1995 | Jenkins et al. |
| 5,675,691 A | 10/1997 | Edlinger et al. |
| 5,689,523 A | 11/1997 | Seguin |
| 6,031,243 A | 2/2000 | Taylor |
| 6,107,843 A | 8/2000 | de Gouy et al. |
| 6,144,677 A | 11/2000 | Komine et al. |
| 6,215,807 B1 | 4/2001 | Reilly |
| 6,310,715 B1 | 10/2001 | Moore |
| 6,687,274 B2 | 2/2004 | Kahen |
| 6,714,581 B2 | 3/2004 | Corcoran |
| 6,717,719 B1 | 4/2004 | Moore |
| 6,826,224 B2 | 11/2004 | Yuri et al. |
| 6,853,660 B2 | 2/2005 | Spoonhower et al. |
| 6,882,781 B2 | 4/2005 | Ionov |
| 6,959,027 B1 | 10/2005 | Guilfoyle et al. |
| 2003/0063633 A1 | 4/2003 | Zhang et al. |

OTHER PUBLICATIONS

Raab and Menzel., "Phase-Locked Array of 25 Broad-Area Lasers." *Proceedings of SPIE: Laser Resonators and Beam Control V*, v. 4629, pp. 24-30, 2002.

M. Jr. DiDomenico, "A single-frequency $TEM_{00}$—mode gas laser with high output power", Appl Phys. Lett. 8, No. 1, 20-22 (1966).

M. Jr. DiDomenico, "Characteristics of a single-frequency Michelson-type He-Ne gas laser", IEEE JQE QE-2, No. 8, 311-322 (1966).

M. Brunel, A. Le Floch and F. Bretenaker, "Multiaxis laser eigenstates", J. Opt. Soc. Am. B 13, 946-960 (1996).

J.R. Leger, G.J. Swanson and W.B. Veldkamp, "Coherent addition using binary phase gratings", Applied Optics 26, 4391-4399 (1987).

T.S. Rutherford and R.L. Byer, "Six beam phase-locked slab laser resonator", CLEO/Europe-EQEC, the $15^{th}$ international conference on lasers and electrooptics, Munich Germany (2001).

S. Menard, M. Vampouille, A. Desfarges-Berthelemot, V. Kermene, B. Colombeau and C. Froehly, "Highly efficient phase locking of four diode pumped Nd:YAG laser beams", Opt. Comm. 160, 344-353 (1999).

D. Sabourdy, V. Kermene, A. Desfarges-Berthelemot, M. Vampouille and A. Barthelemy, "Coherent combining of two Nd:YAG lasers in Vernier-Michelson-type cavity", Appl. Phys. B 75 503-507 (2002).

V.A. Kozlov, J. Hernandez-Cordero and T.F. Morse, "All-fiber coherent beam combining of fiber lasers", Opt Lett. 24, 1814-1816 (1999).

D. Sabourdy, V. Kermene, A. Desfarges-Berthelemot, L. Lefort and A. Barthelemy, C. Mahodaux and D. Pureur, "Power scaling of fiber lasers with all-fiber interferometric cavity", Electronics Letters 38, No. 14, 692-693 (2002).

A. Shirakawa, T. Saitou, T. Sekiguchi and K. Ueda, "Coherent addition of fiber lasers by use of a fiber coupler", Optics Express 10, No. 21, 1167-1172 (2002).

D. Sabourdy, V. Kermene, A. Desfarges-Berthelemot, L. Lefort and A. Barthelemy, "Efficient coherent combining of widely turnable fiber lasers", Optics Express 11, vol. 2, 87-97 (2003).

G. Machavariani, N. Davidson, A. Ishaaya, E. Hasman, and A.A. Friesem, "Efficient formation of high-quality beam from a pure high order Hermite-Gaussian mode", *Opt Lett.* 27, 1501-1503 (2002).

A.A. Ishaaya, G. Machavariani, N. Davidson, E. Hasman, and A.A. Friesem, "Conversion of a high-order mode beam into a nearly Gaussian Beam using a single interferometric element", Opt. Lett. 28, 504-506 (2003).

Oran et al., Progress in Optics, vol. 42, pp. 325-385, 2001.

(T=0.5, 0.33,...1/N Beam splitter)

(GENERAL ART)

RESONATOR CAVITY CONFIGURATION AND METHOD

This is a National Phase Application filed under 35 U.S.C. 371 as a national stage of PCT/IL2004/001141, with the filing date of Dec. 16, 2004, an application claiming the benefit under 35 USC 119(e) U.S. Provisional Patent Application No. 60/530,259 filed on Dec. 18, 2003, the entire content of which is hereby incorporated by reference in its entirety.

FIELD OF THE INVENTION

This invention relates to a resonator cavity configuration and a method of laser beam generation.

LIST OF REFERENCES

The following references are considered to be pertinent for the purpose of understanding the background of the present invention:

[1] M. Jr. DiDomenico, "A single-frequency $TEM_{00}$—mode gas laser with high output power", Appl Phys. Lett. 8, no. 1, 20-22 (1966).

[2] M. Jr. DiDomenico, "Characteristics of a single-frequency Michelson-type He—Ne gas laser", IEEE JQE QE-2, no. 8, 311-322 (1966).

[3] M. Brunel, A. Le Floch and F. Bretenaker, "Multiaxis laser eigenstates", J. opt. Soc. Am. B 13, 946-960 (1996).

[4] J. R. Leger, G. J. Swanson and W. B. Veldkamp, "Coherent addition using binary phase gratings", Applied Optics 26, 4391-4399 (1987).

[5] T. S. Rutherford and R. L. Byer, "Six beam phase-locked slab laser resonator", CLEO/Europe-EQEC, the $15^{th}$ international conference on lasers and electrooptics, Munich Germany (2001).

[6] S. Menard, M. Vampouille, A. Desfarges-Berthelemot, V Kermene, B. Colombeau and C. Froehly, "Highly efficient phase locking of four diode pumped Nd:YAG laser beams", Opt. Comm. 160, 344-353 (1999).

[7] D. Sabourdy, V. Kermene, A. Desfarges-Berthelemot, M. Vampouille and A. Barthelemy, "Coherent combining of two Nd:YAG lasers in a Vernier-Michelson-type cavity", Appl. Phys. B 75, 503-507 (2002).

[8] V. A. Kozlov, J. Hemandez-Cordero and T. F. Morse, "All-fiber coherent beam combining of fiber lasers", Opt Lett. 24, 1814-1816 (1999).

[9] D. Sabourdy, V Kermene, A. Desfarges-Berthelemot, L. Lefort and A. Barthelemy, C. Mahodaux and D. Pureur, "Power scaling of fiber lasers with all-fiber interferometric cavity", Electronics Letters 38, no. 14, 692-693 (2002).

[10] A. Shirakawa, T. Saitou, T. Sekiguchi and K. Ueda, "Coherent addition of fiber lasers by use of a fiber coupler", Optics Express 10, no. 21, 1167-1172 (2002).

[11] D. Sabourdy, V. Kermene, A. Desfarges-Berthelemot, L. Lefort and A. Barthelemy, "Efficient coherent combining of widely tunable fiber lasers", Optics Express 11, vol. 2, 87-97 (2003).

[12] G. Machavariani, N. Davidson, A. Ishaaya , E. Hasman, and A. A. Friesem, "Efficient formation of high-quality beam from a pure high order Hermite-Gaussian mode", Opt. Lett. 27, 1501-1503 (2002).

[13] A. A. Ishaaya, G. Machavariani, N. Davidson, E. Hasman and A. A. Friesem, "Conversion of a high-order mode beam into a nearly Gaussian Beam using a single interferometric element", Opt. Lett. 28, 504-506 (2003);

[14] Oron et al., Progress in Optics, vol. 42, pp.325-385, 2001.

BACKGROUND OF THE INVENTION

High-power lasers are typically characterized by inferior beam quality, stability, and heat dissipation, as compared to that of lower power lasers. Combining several low-power lasers by incoherently adding the field distributions of several laser output beams results in that the combined beam-quality factor $M^2$) is relatively poor with low optical brightness. When the field distributions are coherently added, with the proper phase relations, the combined beam quality factor can be as good as that of one low-power laser, while the combined power is greater by a factor equal to the number of the lasers.

When coherently combining two or more laser output fields, two major difficulties are encountered. The first results from the need for proper coupling between the individual laser fields, so as to enable relative phase locking between them. Such coupling typically introduces excessive losses to each laser field, and requires very accurate relative alignment. The second (and somewhat related) difficulty results from the need for accurately controlling the relative phase between the different laser fields, so as to ensure constructive interference between them. This requires that the distances between the participating optical components must be very accurately controlled, causing the output power to be extremely sensitive to thermal drifts and acoustic vibrations.

Attempts have been made to obtain high power concomitantly with good beam quality based on intra-cavity phase locking and coherent addition of lasers [1-7]. Several techniques dealing with intra-cavity coherent addition of single transverse mode ($TEM_{00}$) laser beams in fiber lasers have been developed [8-11]. According to these techniques, the phase locking and coherent addition is accomplished by the use of fiber couplers. Single transverse mode fiber couplers (2×2 for example) have been used recently to obtain intra-cavity coherent addition of single transverse mode ($TEM_{00}$) laser beams in a fiber laser configuration [8-11]. Here, one of the output terminals of the 2×2 standard single mode fiber coupler was angle spliced so that no reflection from that terminal is present. The resulting coupler's operation when placed in a resonator is similar to that of a 50% beam splitter. This approach, however, is applicable only in fiber laser systems, and designed only for single $TEM_{00}$ beams.

U.S. Pat. No. 3,414,840 discloses a technique of synchronization of power sources. Here, two laser oscillators are used, each including a first mirror and a laser medium and each sharing in common a second mirror, and means for extracting wave energy from the oscillators. The first mirrors and the common second mirror form a pair of resonant cavities. A 3 db hybrid junction, having two pairs of conjugate ports located within a common region of the cavities, is used for coupling wave energy among the mirrors and out of the cavities. The laser medium for each oscillator is located between one of the first mirrors and one port of one of the pairs of conjugate ports. This arrangement utilizes discrete beam splitters within the resonator in order to coherently add two or more laser channels, operating in the $TEM_{00}$ transverse mode, and obtain a single transverse and longitudinal mode (single frequency) output beam.

Techniques have also been developed for external coherent combining of two lobes of a transverse high order mode distribution emerging from a laser [12-13].

SUMMARY OF THE INVENTION

There is a need in the art to obtain high-power laser characterized by improved beam quality, stability, and heat dissipation.

The present invention solves the above problems by providing a novel approach for intra-cavity coherent addition of two or more laser beams that enables stable operation. The present invention takes advantage of synchronizing and coherently adding two or more laser oscillators (with one or more gain media), to produce a higher power output, and utilizes various new intra-cavity couplers and resonator cavity configurations in order to add two or more $TEM_{00}$ mode beams, two or more single high-order-transverse-mode beams, and two or more transverse multimode beams.

Additionally, the technique of the present invention enables one laser beam with the lowest transverse modal content to impose its low transverse modal content on the other participating laser beam(s), so that all beams can be phase locked, as well as phase locked and added coherently within the laser cavity.

The present invention also provides for unique couplers incorporated in a laser cavity for coupling between beams propagating through the laser cavity. Such coupler could contain several optical elements on a single glass substrate, and is thus extremely compact and stable against vibrations and thermal drifts.

Thus, according to one broad aspect of the present invention, there is provided a resonator cavity comprising at least one gain medium and end reflectors which define together longitudinal modes of light in the cavity, the cavity further comprising an intra-cavity beam coupler assembly configured to split light impinging thereon into a predetermined number of spatially separated light channels, and to cause phase locking and at least partial coherent combining of the light channels, which have common longitudinal and transverse modes, in a double pass through the beam coupler assembly, the resonator cavity being configured and operable to produce at least one output combined light channel of a predetermined intensity profile.

It should be understood that the term "intensity profile" used herein is determined by the transverse mode content of light.

The beam coupling assembly may be configured to provide coherent combining of the light channels to produce the single output combined channel. Alternatively, the beam coupler assembly may be configured to provide partial coherent combining of the channels, where each channel gives away or receives some coupling power to one or more other channels, and thus produce a multiplicity of spatially separated output light channels, which are phase locked.

Preferably, the desired lowest transverse mode content at the output is produced by passing light through the appropriately designed aperture arrangement into at least one channel. The aperture arrangement may be configured as a single-aperture or multiple-aperture arrangement. The single aperture may be located in an optical path of one of the spatially separated channels or all of them, being upstream of the beams coupler assembly (with respect to a direction of light propagation from the rear end reflector to the output end reflector); or may be located downstream of the beam coupler assembly so as to be in an optical path of the combined channel propagating towards the output end reflector. Considering the multiple-aperture arrangement, it is located upstream of the beam coupler assembly, each aperture being associated with a respective one of the light channels. It should be noted that "upstream aperture arrangement" with respect to the beam coupler assembly may be located either upstream or downstream of the gain medium.

When the light channels are associated with the same gain medium and the beam coupler assembly is configured as an interferometric coupler assembly with uniform transmission regions, no aperture arrangement may be used, thus resulting in the output in the form of a single large intensity profile (distribution) channel with well define phase.

According to one embodiment of the invention, in which two or more laser beams are phase locked and coherently added, the beam coupler assembly is an interferometric coupler assembly. In the simplest implementation of such an interferometric coupler, the coupler, formed with discrete and separate elements, is a beam splitter/combiner of predetermined transmission/reflection, for example a beam/splitter combiner disclosed in the above-indicated U.S. Pat. No. 3,414,840. Considering N gain media in the resonator cavity producing N light channels, respectively, the beam coupler assembly includes (N−1) simple beam splitter/combiners.

In another possible implementation of the interferometric coupler, the coupler is a planar interferometric two-beam coupler. The coupler is formed of a high precision plane parallel plate with specially designed coatings. According to yet another possible implementation, the coupler is a planar interferometric N-beam coupler. This coupler is somewhat more complex than the simple two-beam coupler, and is used for intra-cavity phase locking and subsequent coherent addition of more than two laser beams.

The planar interferometric coupler element for coherent addition is preferably a plane parallel plate with its front or rear facet or each of the front and rear facets having a predetermined pattern formed by regions of different transmission/reflectivities. The plane parallel plate has a predetermined thickness d and is oriented with respect to a light propagation axis at a predetermined angle defining a certain angle $\alpha$ of light incidence onto the plate so as to ensure said splitting and said at least partial coherent combining of the light channels in the double pass through the plate.

For the incident angle $\alpha$ the thickness d of the plate is determined as:

$$d = x_0 / \{2 \cos \alpha tg[\arcsin(\sin \alpha/n)]\}$$

wherein $x_0$ is a distance between propagation axes of the light channels, and n is a refractive index of a material of the plate, thereby providing for matching the distance between the light channels so as to enable an optimal overlap between the light channels and their collinear propagation after exiting the beam coupler assembly.

The regions of the different reflectivities on the front facet include a substantially transmitting region (e.g., with an anti-reflecting coating), so as to transmit most, if not all, of the incident light, and include at least one region of a predetermined beam splitting property. The regions of the different reflectivities on the rear facet include a relatively large highly reflective region, and may include a substantially transmitting region (e.g., an anti-reflecting coating).

Generally, the need for anti-reflecting coatings can be eliminated by orienting the beam coupler at a Brewster angle with respect to the cavity axis, and by operating with a specific linear polarization of light.

When operation of the beam coupler assembly in the reflection mode is desired, it is implemented by locating the output end reflector in the optical path of a light portion reflected from the beam splitting region on the front facet of the beam coupler assembly; and optionally also providing the entirely highly reflective rear facet of the beam coupler assembly with the beam splitting region on the front facet being located between two light transmitting regions. In the latter case, care should be taken to appropriately align the end reflector so as to be in an optical path of light propagation from the reflective rear facet through the light transmitting region of the front facet and be outside an optical path of light reflected from the beam splitting region of the front facet.

The dimensions of the regions of different reflectivities of the front and rear facets and the orientation of the plane parallel plate is such that: the substantially transmitting region of the front facet is aligned with the highly reflective region of the rear facet thereby allowing light passage through the plate to the highly reflective region where it is reflected towards the beam splitting region in the front surface and then the light is reflected towards the highly reflective region, and so on; and optionally, especially when operation in the transmission mode is required, one beam splitting region of the front facet is aligned with the substantially transmitting region of the rear facet, so that the light propagation through these regions defines a light output of the beam coupler.

The front facet of the plane parallel plate may comprise the single beam splitting region, thereby producing two light channels. Generally, the front facet has the substantially transmitting region (e.g., anti-reflective coating) and (N−1) beam splitting regions for N light channels, respectively. Each i-th beam splitting region, i=2, ... N, has a reflectivity of (1-1/i) or a transmittance of 1/i, such that the first light channel is substantially not affected by the front facet and the other (N−1) light channels are differently affected by the (N−1) beam splitting regions, respectively.

The planar interferometric coupler assembly may comprise the single plane parallel plate with the patterned front and rear facets. Alternatively, the interferometric coupler assembly may include a pair of first interferometric coupler elements (e.g., the above-described patterned plane parallel plates) associated with a pair of the gain media, respectively, and operating to produce two combined light components, respectively; and a second interferometric coupler element (e.g., the patterned plane parallel plate) for coupling these two combined light components, to produce the single output coherently combined channel.

The interferometric coupler assembly may be configured as a phase locking coupler assembly. Similarly, this is preferably a plane parallel plate with patterned front and rear facets, which has a predetermined thickness and predetermined orientation with respect to the cavity axis. The regions of the different reflectivities on the front facet include a substantially transmitting region (e.g., with an anti-reflecting coating) and at least one region of a predetermined partially light transmitting property, and the regions of the different reflectivities on the rear facet include at least one region of a predetermined partially light transmitting property and a substantially transmitting (anti-reflecting) region. The dimensions of these regions and the orientation of the plane parallel plate are such that one partially transmitting region of the front facet is aligned with the substantially anti-reflecting region of the rear facet. The substantially anti-reflecting region of the front facet is aligned with the partially transmitting region of the rear facet thereby allowing light passage through the plate to the partially transmitting region on the rear facet. Light is reflected from the partially transmitting region of the rear facet towards the partially transmitting region of the front facet; and then light is reflected back towards the partially transmitting region on the rear facet, and so on.

According to another embodiment of the invention, the beam coupler assembly is configured for polarization coupling of the light channels. Polarization couplers are based on exploiting the polarization state of the beams and the effect of conventional polarizers on this state. The polarization coupler assembly includes two polarizers accommodated in a spaced-apart relationship along the cavity axis; and an optical element configured as a $\lambda/2$ retardation plate or 45° polarization rotator accommodated between the two polarizers.

As indicated above, the aperture arrangement may be configured to define a single aperture or multiple apertures. The aperture has a diameter capable of selecting the desired lowest transverse mode content from the light passing therethrough, which may be Gaussian mode distribution, the desired multiple-transverse-mode distribution, or single high-order transverse-mode distribution in which case an appropriate phase element is used.

According to yet another aspect of the invention, there is provided a resonator cavity comprising at least one gain medium and end reflectors which define together longitudinal modes of light in the cavity, the resonator cavity further comprising:
(a) a beam coupler assembly configured to split light impinging thereon into a predetermined number of spatially separated light channels, and to cause phase locking and coherent combining of the light channels, having common longitudinal and transverse modes, in a double pass through the beam coupler assembly, to thereby produce an output combined light channel, the beam coupler assembly being configured for polarization coupling of the light channels and comprising two polarizers accommodated in a spaced-apart relationship along an axis of the cavity; and an optical element configured as a $\lambda/2$ retardation plate or 45° polarization rotator accommodated between the two polarizers; and
(b) an aperture arrangement configured to select in at least one of the light channels a predetermined transverse mode that is desired at the cavity output.

According to another aspect of the present invention, there is provided a beam coupler element for use in a resonator cavity for affecting the light propagation through the resonator cavity to provide an output light channel in the form of coherent addition of at least two light channels having at least one common longitudinal mode, the beam coupler assembly comprising:
a plane parallel plate with its front and rear facets being patterned to have regions of predetermined transmission or reflectivities, wherein
the front facet includes a substantially transmitting region and (N−1) beam splitting regions for N light channels, respectively, each i-th beam splitting region, i=2, ... N, having a reflectivity of (1-1/i) or a transmittance of 1/i, such that the first light channel is substantially not affected by the front facet and the other (N−1) light channels are differently affected by the (N−1) beam splitting regions, respectively;
the rear facet includes a highly reflective region; and
dimensions of said regions of the front and rear facets and orientation of the plane parallel plate with respect to the light channels' propagation axis are such that light is reflected from the highly reflective region towards the beam splitting region and vice versa.

According to yet another aspect of the present invention, there is provided a beam coupler element for use in a resonator cavity for affecting the light propagation through the resonator cavity to provide at least two output light channels of desired transverse/longitudinal modes, the beam coupler assembly comprising:

a plane parallel plate with its front and rear facets being patterned to have regions of predetermined transmission or reflectivities, wherein the front facet includes a substantially transmitting region and at least one predetermined beam splitting region;

the rear facet includes a substantially transmitting region and at least one predetermined beam splitting region; and dimensions of said regions and orientation of the plane parallel plate with respect to the light channels' propagation axis are such that light is reflected from the beam splitting region of the rear facet towards the beam splitting region of the front facet and vice versa.

According to yet another aspect of the present invention, there is provided a beam coupler element for use in a resonator cavity for controlling light propagating through the resonator cavity to provide at least two output light channels of desired transverse and longitudinal modes, the beam coupler assembly comprising: a plane parallel plate with its front and rear facets carrying first and second gratings, respectively, the first grating splitting the light into various diffraction orders and allowing their propagation inside the plate towards the second grating.

BRIEF DESCRIPTION OF THE DRAWINGS

In order to understand the invention and to see how it may be carried out in practice, preferred embodiments will now be described, by way of non-limiting example only, with reference to the accompanying drawings, in which:

FIGS. 9A and 9B schematically illustrate the principles of intra-cavity coherent addition of several single (or multiple) mode beam distributions derived from separate fiber lasers using discrete beam splitters couplers, wherein FIG. 9A shows intra-cavity sequential addition configuration and FIG. 9B shows intra-cavity coherent addition of pairs configuration;

FIGS. 14 to 16 illustrate yet another embodiment of the invention providing phase locking of laser beams, wherein FIG. 14 shows intra-cavity phase locking of two Gaussian beam distributions using a single interferometric coupler, FIG. 15 shows the calculation results for the feedback after a double pass through the coupler of FIG. 14 for three cases, corresponding to, respectively, incoherent summation of laser beams, and positive and negative coherent summation of the beams.

FIGS. 17A and 17B schematically illustrate the principles of the present invention aimed at improving the beam quality of multimode resonators, wherein FIG. 17A shows the general configuration of the multimode laser resonator and FIG. 17B shows a laser resonator of the present invention with an array of 2×2 Gaussian beam distributions.

DETAILED DESCRIPTION OF THE INVENTION

The present invention provides for a novel method for light propagation in resonator cavity and novel resonator cavity configuration enabling intra-cavity phase locking, or intra-cavity phase locking and coherent addition, of two or more laser beams. Various examples of the laser cavity configurations of the present invention are described below. The configurations, as well as light propagation schemes, are shown in the figures schematically, and it should be understood that these configurations could be realized with basically all types of stable resonators (various mirror curvatures or other intra-cavity optical elements), with various types of gain mediums (gas, solid-state, diode, fiber, etc.), with various types of operational methods (CW, pulsed free running, Q-switched pulsed, etc.), etc.

Figure 1A:
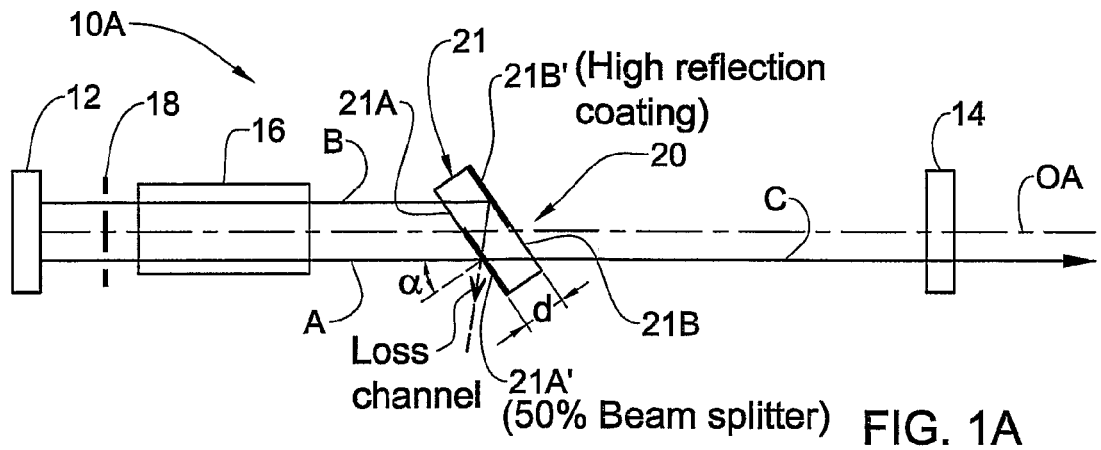
FIG. 1A is a schematic illustration of a resonator cavity configuration according to one embodiment of the invention, configured for intra-cavity coherent addition of two Gaussian beam distributions using a single interferometric coupler.

Referring to FIG. 1A, there is schematically illustrated an example of a resonator cavity, generally at 10A, configured for intra-cavity phase locking and coherent addition of two light channels. The resonator cavity 10A typically includes a back mirror arrangement 12 and an output coupler 14 (constituting end reflectors, respectively), and a gain medium 16 (laser rod), which together define the longitudinal modes (frequencies) of the cavity 10A. The back mirror 12 is preferably flat, while the output coupler 14 may be either flat or concave for stable laser operation. According to the invention, the resonator cavity 10A further includes a beam coupler assembly 20 accommodated downstream of the gain medium 16 (with respect to a direction of light propagation from the back mirror arrangement 12 to output coupler 14), and in the present example also includes an aperture arrangement 18, which in the present example is accommodated between mirror 12 and gain medium 16. Generally, the aperture arrangement, when accommodated upstream of the beam coupler assembly, may be positioned either upstream or downstream of the gain medium. As will be exemplified further below, the aperture arrangement may be associated with a combined output channel propagating towards the output end reflector 14.

Generally, the beam coupler assembly of the present invention is configured to split the laser light into a predetermined number of spatially separated light channels and to cause either a partial combining of the light channels, or coherent addition of the light channels with common longitudinal modes (frequencies) and common transverse modes, to thereby produce one or more output combined light channel(s). The beam coupler assembly is configured to involve a loss mechanism whereby the beams do not suffer any loss in case of a specific relative phase between the beams, and suffer severe losses otherwise.

The aperture arrangement is configured to select in at least one light channel a predetermined transverse mode content (determining the intensity profile) that is desired at the cavity output.

In the present example of FIG. 1A, the cavity 10A is configured for coherently adding two Gaussian $TEM_{00}$ beam distributions. Consequently the aperture arrangement 18 includes a double-aperture with diameters suitable for fundamental $TEM_{00}$ operation in each of the two channels. The beam coupler assembly 20 is configured for interferometric coupling and includes a single coupling element in the form of a planar interferometric two-beam coupler.

It should be noted that instead of using the single gain medium (laser rod) with two channels, two separate laser rods can be used. In this case, a back mirror arrangement (12 in FIG. 1) could include two back mirrors associated with two laser rods, respectively.

The beam coupler 20 is configured as a high precision plane parallel plate 21, with the front and rear facets of the plate having specially designed patterns, namely, regions of different transmission/reflectivity. The front facet has a substantially light transmitting region 21A (e.g., coated with an anti-reflection layer) and a beam splitting region 21A', and the rear facet has a substantially light transmitting region 21B (e.g., coated with an anti-reflection layer) and a highly reflective region 21B'.

It should be noted that in this example, as well as in all other examples, by orienting the beam coupler at a Brewster angle with respect to the cavity axis OA and operating with a specific linear polarization of light the need for anti-reflecting coatings is eliminated.

The plate 21 has a predetermined thickness d and is oriented with respect to the cavity axis OA (i.e., to the laser beams) at a predetermined angle defining a certain angle $\alpha$ of light incidence onto the plate 21 selected in accordance with the required distance between two beams A and B thus providing for the two beams optimal overlapping and collinear propagation after exiting the coupler through the anti-reflective region 21B (i.e., to ensure the splitting and coherent addition of two light channels). For an incident angle $\alpha$, thickness d of the plate 21 is determined by the simple relation:

$$d=x_0/\{2\cos\alpha tg[\arcsin(\sin\alpha/n)]\}$$

where $x_0$ is the distance between the two beams A and B, and n is the refractive index of the material of the plate 21.

The dimensions of the pattern regions and the orientation of the plate 21 are such that the light transmitting region 21B and the beam splitting region 21A' are aligned, so as to define the output of the coupler 20 for the combined channel C, and the light transmitting region 21A and the highly reflective region 21B' are aligned so as to ensure that light is reflected from the highly reflective region 21B' towards the beam splitting region 21A'. Thus, the beam of one channel A is directly incident on the beam splitting region 21A', while the beam of the other channel B is transmitted through the region 21A, reflected back from the rear facet region 21B' and is incident on the beam splitter coating 21A so as to be collinear with the transmitted beam A.

In this specific example, where the channels are produced by the same gain medium 16, input beams A and B are of substantially equal intensities. Accordingly, one half 21A of the front facet is substantially transmitting and the other half of this facet is coated with a 50% beam splitter layer 21A', while half of the rear facet is coated with the highly reflecting layer 21B' and the other half 21B of this facet is substantially transmitting. It should be understood that in case of different intensities of the input beams A and B (different gain levels), an appropriate transmission of the beam splitting region 21A' of the coupler 20 should be chosen.

If the input beams A and B incident on the 50% beam splitter are in phase, there would be no loss. If the two input beams have a $\pi$-phase difference, then destructive interference would occur and there would be 100% losses. If the input beams have random relative phase between them (incoherent), then each beam will suffer 50% loss at the coupler 20, so, typically, no lasing will occur. Hence, if the beams add coherently, then the losses introduced by the coupler 20 may be completely suppressed. Indeed, the combined laser will tend to operate so that the losses are minimum, whereby the phases of the individual beams will be automatically matched (automatic phase locking) such that coherent addition takes place. This of course can be achieved only for those longitudinal modes (frequencies) that are common in the two laser channels. Thus, care must be taken to either perfectly equalize the optical length of the two resonator channels, or alternatively, to imbalance them in such a manner so as to obtain one or more mutual longitudinal modes. To this end, additional optical elements, such as optical cubes or plates, could be inserted into the channels to obtain the appropriate optical path lengths.

It should be noted that an appropriate design of the optical path length difference between the intracavity channels, taking into account the gain bandwidth, could result in a single frequency output (or very narrow linewidth output) from the resonator cavity. In the resonator cavity configuration utilizing a single-coupler assembly (for example as that exemplified in FIG. 1A), slight tilting of the interferometric plate results in wavelength tuning within the gain bandwidth. This could be implemented using for example a piezo motor, achieving very fast tuning rates.

Figure 1B:
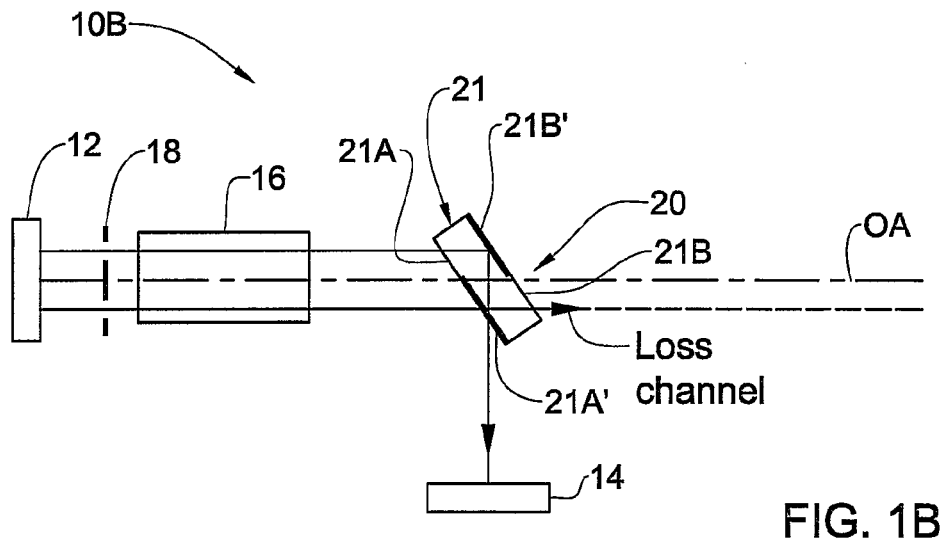
FIGS. 1B and 1C are schematic illustrations of resonator cavities according to another embodiment of the invention, exemplified as being configured for intra-cavity coherent addition of two Gaussian beam distributions using a single interferometric coupler.
Figure 1C:
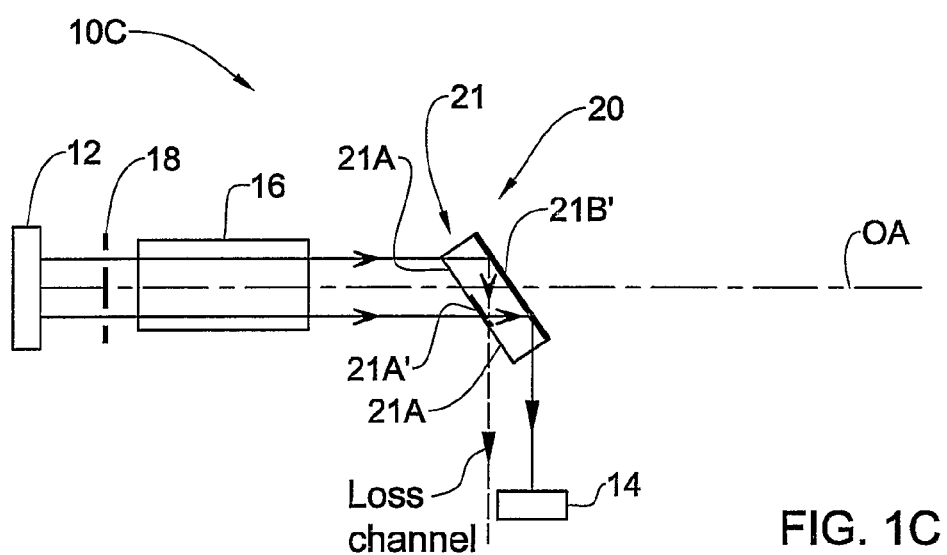

The above-described example of FIG. 1A presents the transmission mode configuration of a resonator cavity. Referring to FIGS. 1B and 1C, there are shown two examples, respectively, of a resonator cavity configured for the reflection mode operation. To facilitate understanding, the same reference numbers are used for identifying those components that are common in all the examples of the invention. Resonator cavities 10B and 10C are shown, each configured generally similar to the above-described resonator cavity 10A, namely, including end reflectors 12 and 14, a gain medium 16, an interferometric beam coupler assembly 20 configured as a high precision plane parallel plate 21, and an aperture arrangement 18. In these examples, in distinction to that of FIG. 1A, the output coupler 14 is located in an optical path of a light portion reflected from the beam coupler assembly 20 and emerging from the front facet thereof. In the example of FIG. 1B, the interferometric plate 21 is similar to that of FIG. 1A, namely, includes light transmitting and beam splitting regions 21A and 21A' on the front facet, and highly reflective and transmitting regions 21B' and 21B on the rear facet. In the example of FIG. 1C, the interferometric plate 21 has a somewhat different pattern of reflective/transmitting regions on its front and rear facets: the rear facet is entirely highly reflective 21B' and the front facet has a beam splitting region 21A' surrounded by substantially light transmitting regions 21A. In this case, however, the output coupler (mirror) 14 is configured and positioned so as to be in an optical path of a light portion reflected from the rear facet and passing through the transmitting region of the front facet and to be outside an optical path of a light portion reflected from the beam splitting region of the front facet.

Figure 2:
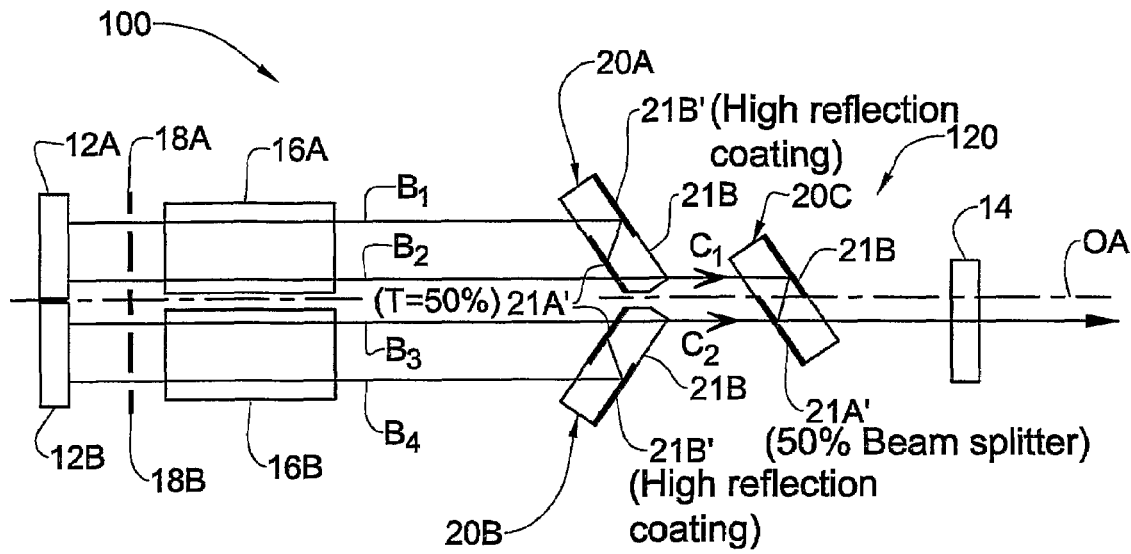
FIG. 2 is a schematic illustration of a resonator cavity configuration according to yet another embodiment of the invention, configured for intra-cavity pair coherent addition of four Gaussian beam distributions using interferometric couplers.

The configurations of FIGS. 1A-1C can be generalized to intra-cavity coherent addition of more than two beams. This is exemplified in FIG. 2 for the transmission mode configuration. FIG. 2 shows a resonator cavity 100 configured to provide for automatic phase locking and coherent addition of four Gaussian beam distributions $B_1$-$B_4$ to form a single Gaussian $TEM_{00}$ output beam C. This addition method will be referred to as "pair addition", since the beams are added in pairs. It should be understood that the pair addition could be extended to more than two beam pairs. In this technique, all laser channels have at least one mutual longitudinal mode (frequency), which might be easier to achieve with a smaller number of laser channels.

The device 100 includes a pair of back mirrors 12A and 12B; gain media 16A and 16B (laser rods) associated with the mirrors 12A and 12B, respectively; a pair of double-aperture arrangements 18A and 18B associated with laser rods 16A and 16B, respectively; an interferometric beam coupler assembly 120; and an output coupler 14. The diameter of each of the apertures is such as to select a Gaussian beam distribution from the respective channel. The beam coupler assembly 120 includes two interferometric couplers 20A and 20B accommodated in optical paths of light passing through the laser rods 16A and 16B, respectively; and an additional planar two-beam interferometric coupler 20C downstream of the couplers 20A and 20B (with respect to the direction of light propagation from the back mirror 12 to the output coupler 14).

The front and rear facets of each of the couplers 20A and 20B are partially coated with, respectively, a 50% transmitting coating 21A' and a highly reflective coating 21B'. The couplers 20A and 20B are configured and oriented such that their coating-patterns (50% transmitting and highly reflective regions 21A' and 21B) are positioned symmetrically identical with respect to the cavity axis OA. The coupler 20C is a planar interferometric two-beam coupler as that described above with reference to FIG. 1A.

Coupler 20A (when in the resonator cavity) operates to perform phase locking and coherent addition of channels $B_1$ and $B_2$, produced by gain medium 16A, resulting in a combined beam $C_1$. Coupler 20B performs phase locking and coherent addition of channels $B_3$ and $B_4$, produced by gain medium 16B, resulting in a combined beam $C_2$. Coupler 20C carries out coherent addition of beams $C_1$ and $C_2$, resulting in a combined output channel C.

Figure 3:
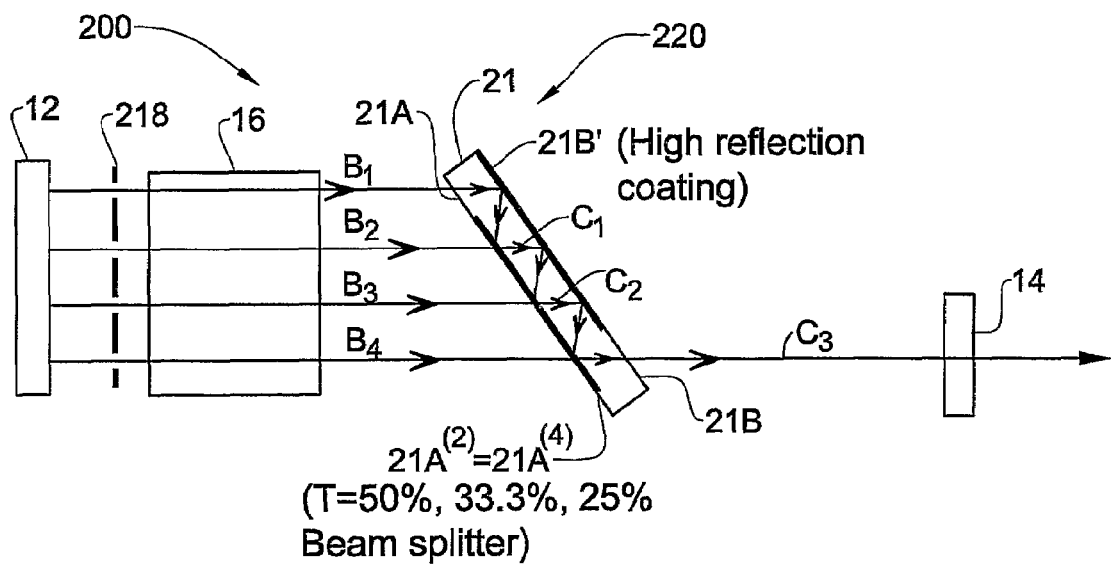
FIG. 3 is a schematic illustration of a resonator cavity configuration according to yet another embodiment of the invention, configured for intra-cavity sequential coherent addition of several Gaussian beam distributions using a single interferometric coupler.

FIG. 3 schematically illustrates another example of a resonator cavity configuration 200 for intra-cavity sequential coherent addition of more than two Gaussian beams. The resonator cavity device 200 includes a back mirror 12; a gain medium 16; a multi-aperture arrangement 218; a beam coupler 220 including a single planar interferometric n-beam coupler; and an output coupler 14. The aperture diameters are adjusted to select the Gaussian mode.

The beam coupler 220 is somewhat more complex than the above-described two-beam coupler, and is used for intra-cavity phase locking and sequential coherent addition of more than two laser beams. The coupler 220 is made of a high precision plane parallel plate 21, with most of its back (rear) facet being coated with a highly reflective layer 21B' and the rest being a substantially transmitting region 21B, while the front facet has 4 sub-areas for 4 light channels, respectively: the first sub-area 21A (associated with the first channel $B_1$) is substantially transmitting (zero reflectivity) and the other three sub-areas $21A^{(2)}$-$21A^{(4)}$ (associated with channels $B_2$-$B_4$, respectively) are coated with different beam-splitter coatings having different transmittance, respectively, namely, 50%, 33.3% and 25%. Minimal loss is obtained in this configuration if channel $B_1$ is coherently added (at the 50% coating) with channel $B_2$, the so-produced combined channel $C_1$ coherently add with channel $B_3$ (at the 33% coating), and the combined channel $C_2$ coherently add with channel $B_4$ (at the 25% coating) to produce a combined output channel $C_3$.

Under certain conditions, the laser 200 (resonator cavity) will tend to operate such that all channels phase lock and add up coherently, so that a Gaussian $TEM_{00}$ beam with increased power is obtained at the output. To ensure that there is at least one common longitudinal mode (frequency), additional optical elements, such as optical cubes or plates, could be inserted into the channels to obtain the appropriate optical path lengths.

Figure 4:
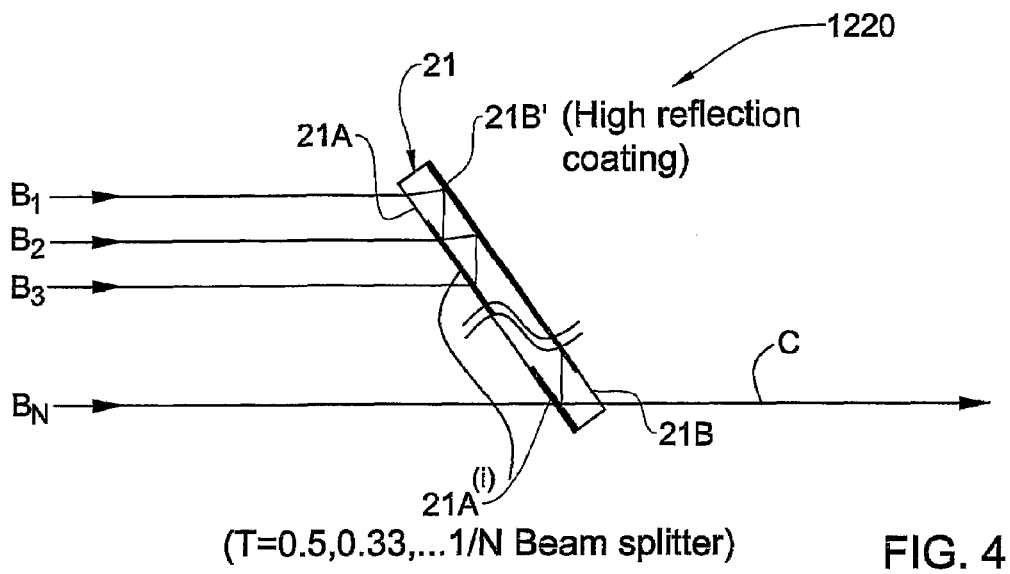
FIG. 4 more specifically illustrates a planar interferometric coupler used in the example of FIG. 3, designed to phase lock and coherently add N light channels when placed in the resonator.

In the present example of FIG. 3, the coupler 220 is designed to phase lock and coherently add four beams. It should, however, be understood that a similar beam coupler assembly can be used to coherently add a larger number of beams. A more general coupler configuration is illustrated in FIG. 4, showing an intra-cavity beam coupler 1220 configured for phase locking and coherent addition of n beams with common longitudinal modes (frequencies) and common transverse mode (e.g., Gaussian mode). The coupler 1220 is made of a high precision plane parallel plate 21, with most of its back (rear) facet being coated with a highly reflective layer 21B' and the rest being a substantially transmitting region 21B, and the front facet having N sub-areas for N light channels, respectively: first sub-area (associated with the first channel) being substantially transmitting 21A (zero reflectivity) and the other (N−1) sub-areas being coated with different beam-splitter coatings, generally at $21A^{(i)}$ (i=2, ..., N) having different reflectivities, respectively. Generally, each i-th beam splitting region has a reflectivity of (1-1/i) or a transmittance of 1/i, such that the first channel is substantially not affected by the front facet and all the other channels are differently affected by the (N−1) regions with transmittance 0.5, 0.33, ..., 1/N, respectively.

For each orientation and/or thickness of the beam coupler 1220, there exists a specific relative phase between two consecutive beams which causes all the beams $B_1$-$B_n$ to coherently add at the output of the beam coupler 1220, producing an increase in output power by a factor of n. If the relative phase between the input beams has a different value or is random, then the beams would suffer losses. In this coupler, the first beam $B_1$, is added with the second beam $B_2$, then the so-produced combined beam is added with the third beam $B_3$, and so on. Hence, each beam is sequentially added to the previously combined beams.

It is important to note and is clearly understood for example from the illustration in FIG. 4, that each of the interferometric coupler configurations of the present invention introduces a constant optical path difference $\Delta L$ between the optical paths of each two successive channels $B_i$ and $B_{(i+1)}$, considering N light beams (i=1, ... N). It should be understood that the optical path length $L_i$ of the channel of beam $B_i$ is the optical distance between the rear and output end reflectors 12 and 14 and the point where the combined channel starts. Thus, the optical path lengths of the channels $B_1$-$B_N$ are $L_1$, $L_1+\Delta L$, $L_1+2\Delta L$, and so on, and the optical length difference between these channels is an integer number of $\Delta L$, namely $n\Delta L$. This configuration ensures common longitudinal modes (frequencies) in all the beams.

It should be noted that in all the configurations described above, if the gain in each channel is different, such that the power of the different channels is unequal, then appropriate beam splitter transmissions should be used.

Figure 5:
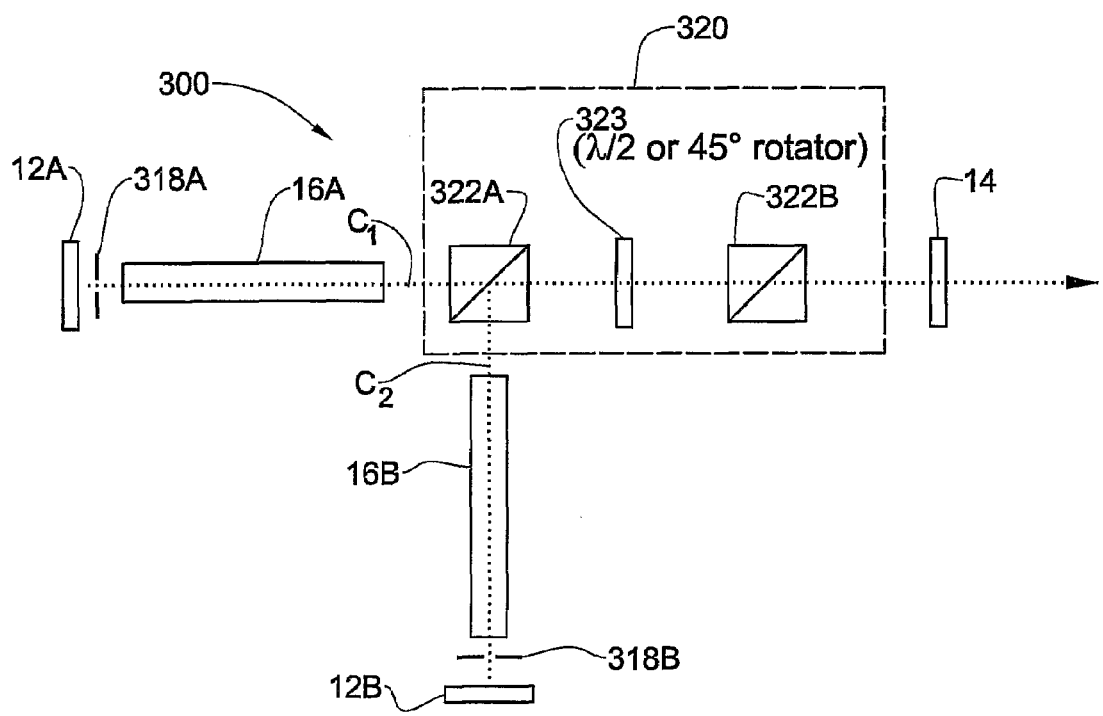
FIG. 5 is a schematic illustration of a resonator cavity configuration according to yet another embodiment of the invention, configured for intra-cavity coherent addition of two Gaussian beam distributions using a polarization coupler.

Reference is now made to FIG. 5 illustrating a resonator cavity configuration 300 according to another embodiment of the invention. The cavity 300 is configured for intra-cavity coherent addition of two Gaussian beam distributions using polarization coupling. The device 300 includes back mirrors 12A and 12B, gain media 16A and 16B, single-aperture arrangements 318A and 318B, a beam coupler assembly in the form of polarization coupler arrangement 320; and an output coupler 14. The configuration defines light propagation channels $C_1$ and $C_2$.

Polarization couplers are based on exploiting the polarization state of beams and the effect of conventional polarizers on this state. The coupler assembly 320 includes two polarizers 322A and 322B and an optical element 323 configured as a $\lambda/2$ retardation plate or 45° polarization rotator.

Minimal losses at polarizer 322A occur if channel $C_1$ has pure p-polarization and channel $C_2$ has pure s-polarization. If the $\lambda/2$ retardation plate 323 (or 45° polarization rotator) is aligned so as to change the polarization plane by 45°, then minimal losses at polarizer 322B are achieved only if the two beams $C_1$ and $C_2$ have a specific relative phase when reaching polarizer 322B (0 or $\pi$ phase, depending on whether the polarization was changed by ±45°). If, for example, the beams $C_1$ and $C_2$ have the correct polarization states but the relative phase between the beams is random, then each beam suffers 50% loss when passing through the coupler. Hence, this coupler 320 coherently adds only two beams with specific polarizations and relative phase at the input. It is thus evident that with the polarization coupler 320, minimal losses are obtained if channel $C_1$ is p-polarized and channel $C_2$ is s-polarized, and if both are in phase. In this case, the laser 300 will tend to arrange the polarization state and the phases such that minimal loss state is obtained.

It should be noted that instead of using the $\lambda/2$ retardation plate or the 45° polarization rotator, it is possible to align the second polarizer 322B at a 45°, and achieve the same performance. It is also possible to reduce/control the losses to the undesired phase states by using a series of Brewster plates instead of the polarizer 322B.

Figure 6:
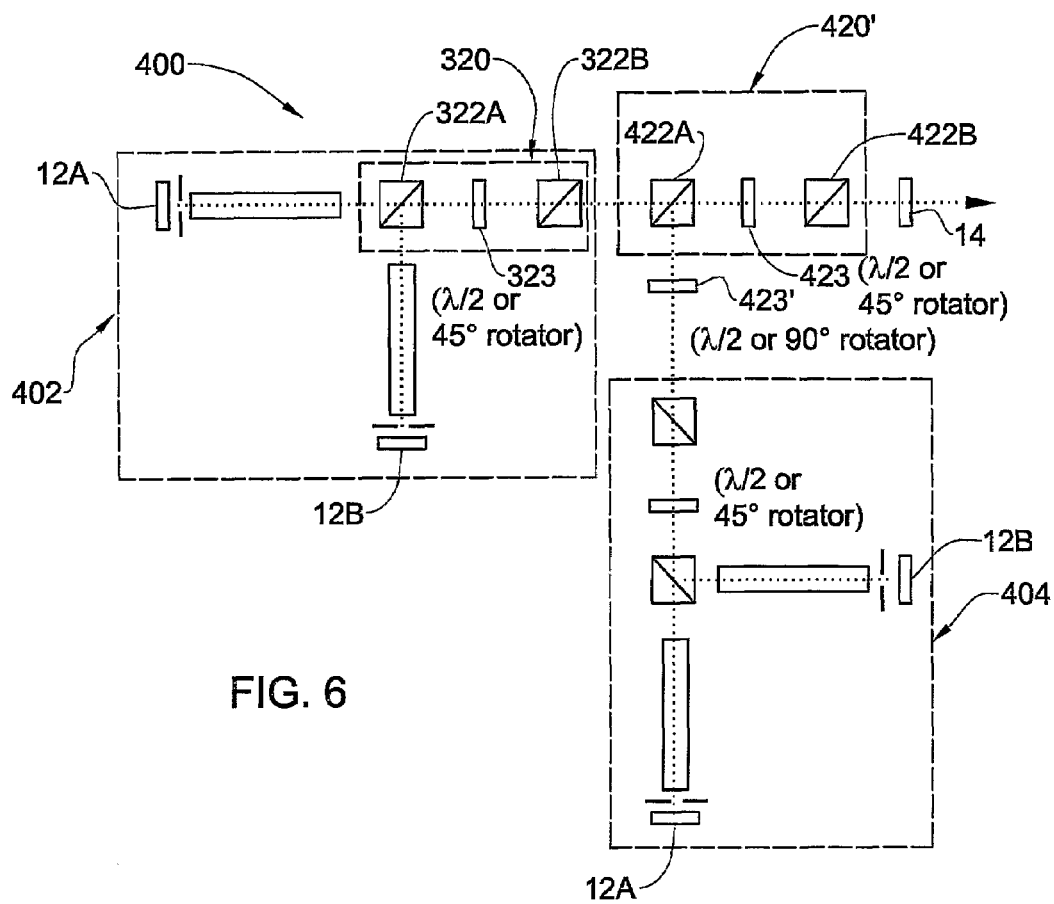
FIG. 6 is a schematic illustration of a resonator cavity configuration according to yet another embodiment of the invention, configured for intra-cavity coherent addition of four Gaussian beam distributions using polarization couplers.

The above concept can be generalized to pair addition of more than two Gaussians. This is exemplified in FIG. 6 showing a resonator cavity 400 configured for intra-cavity coherent addition of four Gaussian beams. The cavity 400 is formed by two arrangements 402 and 404 each including all the elements of the above-described device 300 except for output coupler (namely, includes back mirrors, apertures, gain media, and polarization coupler); an additional common polarization coupler 420'; a $\lambda/2$ or 90° rotator 423' in the optical path of light output from one of the arrangements 402 and 404—arrangement 404 in the present example; and an output coupler 14. The polarization coupler 420' is configured generally similar to coupler 320, namely includes two polarizers 422A and 422B and a $\lambda/2$ retardation plate or 45° polarization rotator 423 therebetween.

The present invention also provides for obtaining increased output power from a resonator cavity, by intra-cavity phase locking and coherent addition of single high-order mode beams. This can be implemented by introducing an appropriately designed phase element (or any other suitable mechanism, such as absorptive wires, phase strips, etc.) into the resonator cavity of each of the above-described configurations to select the same single high-order mode in each of the channels. The principles of using phase elements in order to select high-order transverse modes are known [14].

Figure 7:
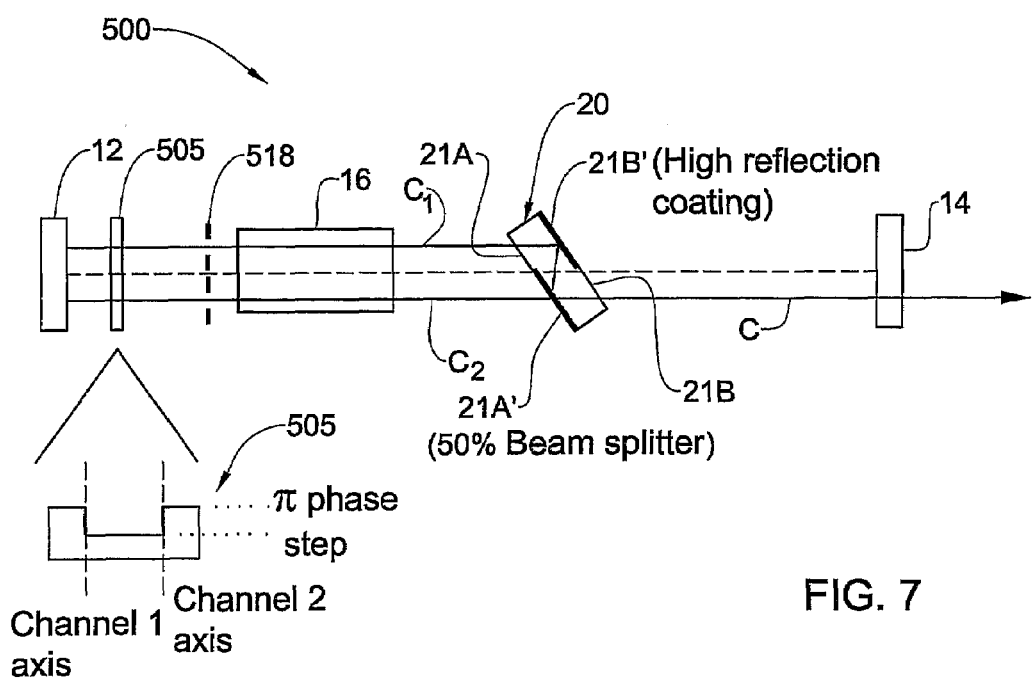
FIG. 7 is a schematic illustration of a resonator cavity configuration according to yet another embodiment of the invention, configured for intra-cavity coherent addition of two single high-order $TEM_{01}$ transverse mode beam distributions using a single interferometric coupler.

FIG. 7 shows a laser cavity 500 configured for intra-cavity coherent addition of two single high-order $TEM_{01}$ transverse mode beam distributions using a single interferometric coupler. The device 500 includes a back mirror 12; a double aperture arrangement 518; a phase element 505; a gain medium 16; a beam coupler assembly 20; and an output coupler 14. Here, the aperture's diameter is adjusted to select a high-order mode distribution. The beam coupler 20 is a planar two-beam interferometric coupler as described above. As shown in the figure, the phase element 505 creates a $\pi$-phase step for each of two channels $C_1$ and $C_2$ and thus selects the $TEM_{01}$ mode distribution in each channel. If light components from the two channels are added incoherently, each light component will suffer 50% losses. With coherent addition, the laser will "chose" to operate such that the two high-order mode beams are phase locked and coherently add at the beam coupler 20. The use of this concept of intra-cavity phase locking and coherent addition of single high-order mode beams provides for obtaining higher output powers than with Gaussian beam combining, and provides for the potential beam quality of the high-order mode beam at the output to be as good as that of a Gaussian distribution.

Figure 8:
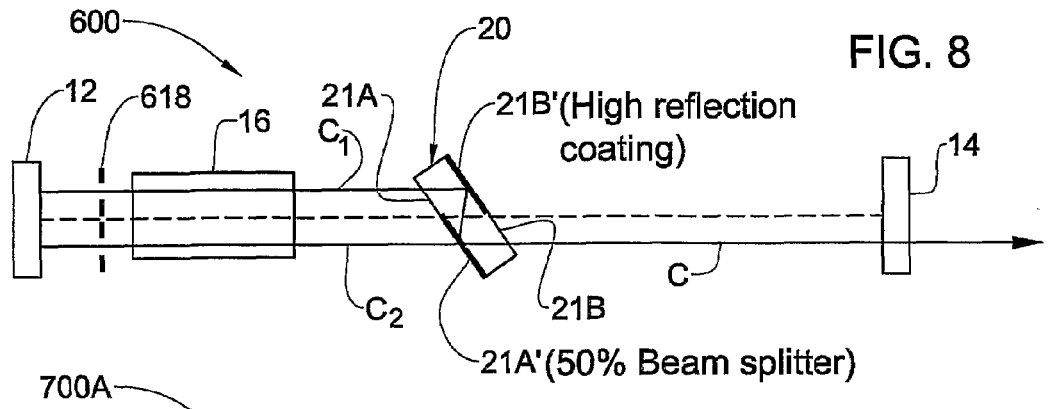
FIG. 8 is a schematic illustration of a resonator cavity configuration according to yet another embodiment of the invention, configured for intra-cavity coherent addition of two multimode transverse beam distributions using a single interferometric coupler.

The technique of the present invention also provides for intra-cavity coherent addition of transverse multimode beams. This is exemplified in FIG. 8, showing a resonator cavity configuration 600, which is generally similar to that of FIG. 1 for coherent addition of two Gaussian beams, but distinguishes therefrom in that the double apertures arrangement 618 has diameters that enable transverse multimode operation in both channels. Minimal loss to both beams at the beam coupler 20 will be achieved if each of the transverse mode distributions in the first channel is phase locked and coherently adds with the corresponding mode distribution in the second channel. Specifically, each individual mode distribution of the overall multimode distribution in one channel will be phase locked and coherently add up to those of the multimode distribution in the other channel: the $TEM_{00}$ mode in both channels will be phase locked and will coherently add up, the $TEM_{01}$ mode in both channels will be phase locked and will coherently add up, and so on. In this case, the resonator cavity 600 will "chose" to operate in this minimal loss state, so that the output beam is a multimode beam (with the same beam quality factor, $M^2$, as that of the single channel beam) but with twice the power. This can be looked upon as coherent addition of multimode beams, where each transverse mode is coherently added, but there is random phase between the various transverse modes.

It should be noted that, generally, each of the above-described examples of the resonator cavity of the present invention can be used to intra-cavity phase lock and coherently add two or more transverse multimode beams, provided suitable apertures are used. Moreover, channels with the same multimode distribution content but different powers can be added coherently, using suitable couplers (with appropriate beam splitting region(s)).

Figure 9A:
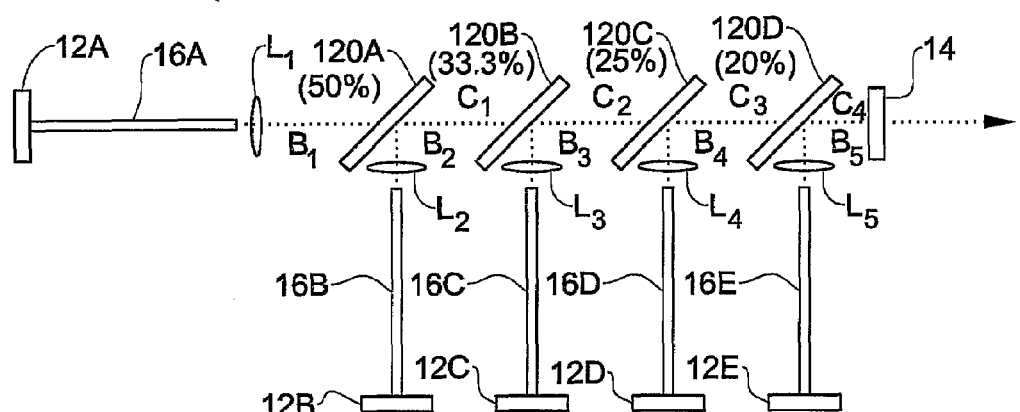
Figure 9B:
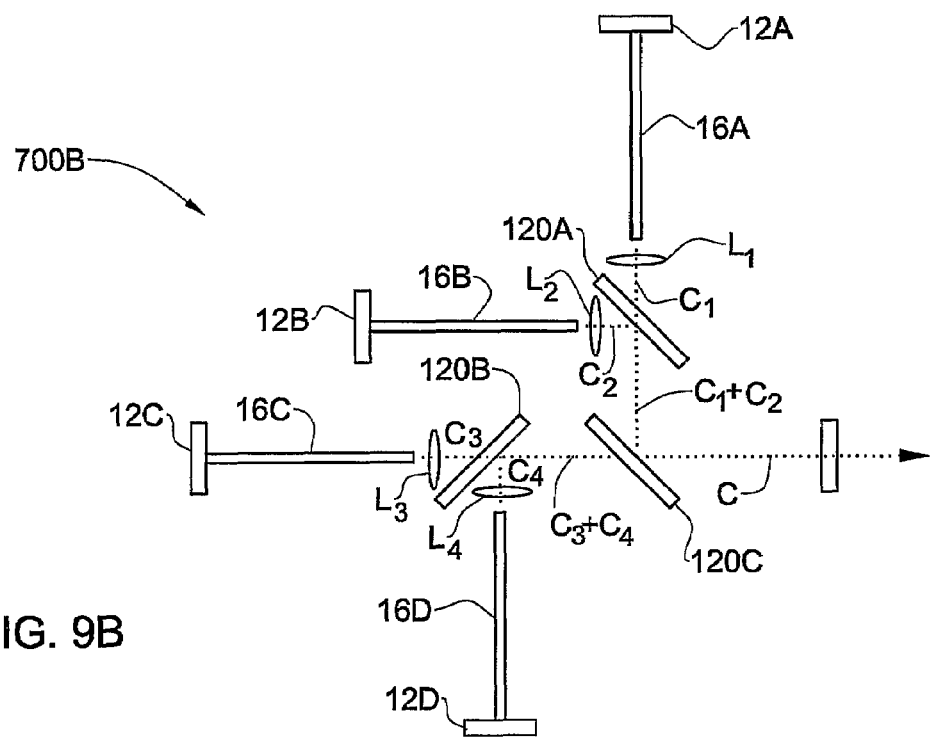

The inventors have found that the resonator cavity may utilize a simple beam splitter coupler for intra-cavity coherent addition of multimode beams (using suitable apertures) or for intra-cavity coherent addition of single high-order mode beams (using, in addition, suitable phase elements as described above). FIGS. 9A and 9B illustrate the principles of intra-cavity coherent addition of several beam distributions derived from separate fiber lasers using discrete beam splitters couplers.

FIG. 9A exemplifies intra-cavity sequential addition configuration. A resonator cavity 700A is shown including back mirrors 12A-12E; gain media 16A-16E (e.g., double-clad fibers); a beam coupler assembly including simple beam splitter couplers 120A-120D; and an output coupler 14. The couplers 120A-120E have 50%, 33.3% m 25% and 20% reflectivities, respectively. Collimation lenses $L_1$-$L_5$ are provided in each of the channels, respectively.

Thus, each of the couplers 120A-120D is a beam splitter of predetermined transmission/reflection. As specifically shown for example for beam splitter 120A, beams $B_1$ and $B_2$ (coming from gain media 16A and 16B, respectively) impinge onto the beam splitter 120A, resulting in an output beam $C_1$ (and possibly also a losses energy part). If input beams $B_1$, and $B_2$ have equal intensities and undergo the 50% beam splitting by the coupler 120A, then (1) for the two beams being in phase they coherently add at the beam splitter 120A and no losses occur, (2) at a $\pi$ phase difference between the beams they interfere destructively at the beam splitter and there are 100% losses, and (3) at random relative phase between input beams $B_1$ and $B_2$ (incoherent) each beam suffers 50% loss at the beam splitter 120. If the input beams $B_1$ and $B_2$ do not have equal intensities, a suitable transmission should be chosen for the beam splitting region of the coupler 120A in order to achieve perfect coherent addition when the beams are in phase.

Thus, the device 700A provides for sequential coherent addition of beams $B_1$-$B_5$ during their propagation towards the output coupler 14: beams $B_1$ and $B_2$ are coherently added at the coupler 120A and a resulting combined beam ($C_1$) is added to beam $B_3$ at coupler 120B, and so on.

FIG. 9B exemplifies intra-cavity coherent addition of pairs in a resonator cavity 700B including back mirrors 12A-12D; gain media 16A-16D; a beam coupler assembly including simple interferometric couplers 120A-120C; and an output coupler 14. Coupler 120A coherently adds channels $C_1$ and $C_2$, coupler 120B adds channels $C_3$ and $C_4$, and the resulting combined channels are added at coupler 120C.

It should be noted, although not specifically shown, that the beam splitters 120A-120C may be replaced by appropriately designed fiber couplers, for example fiber couplers suitable for coupling light from single-mode fibers [9-11], or those capable of coupling light from multi-mode fibers.

Furthermore, the technique of the present invention provides for imposing the transverse modal content of one beam (one laser channel) on one or more of laser channel beams, and then coherently adding all the beams. This can be achieved with any one of the above-described cavity configurations and coupler designs, provided a suitable aperture is used. It should be noted that although in the above-described examples, an aperture was provided in each of the channels, it is possible to use only one suitable aperture in one channel and this will automatically impose the same mode distribution on the other channels. The following are some examples of laser cavity configurations utilizing this concept.

Figure 10:
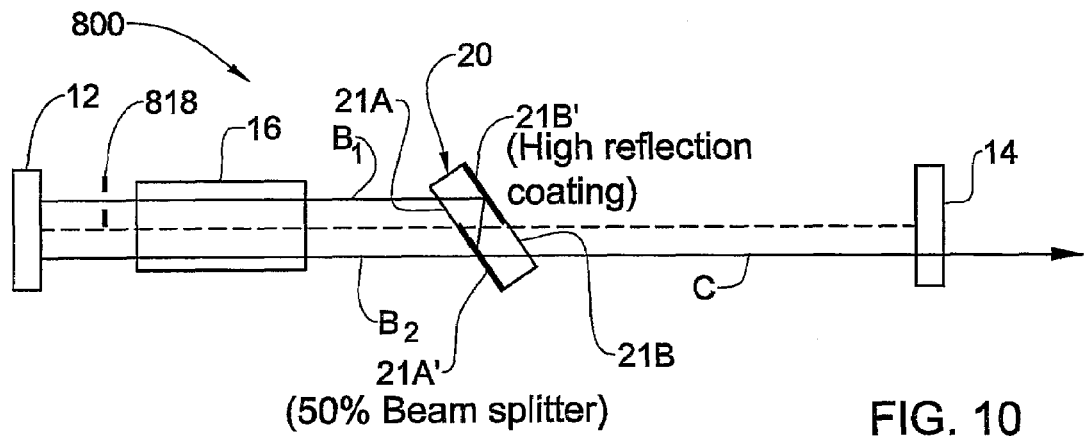
FIG. 10 schematically illustrates yet another embodiment of the invention, where one channel imposes a Gaussian mode on the other channel and coherent addition of the two beams distributions is achieved using a single interferometric coupler.

FIG. 10 shows a resonator cavity 800 including a back mirror 12; an output coupler 14; a gain medium 16; a single-aperture arrangement 818 in one channel associated with laser beam $B_1$; and a beam coupler assembly including a planar two-beam interferometric coupler 20. In the present example, the aperture 818 is configured to select a Gaussian mode from one channel only (that of beam $B_1$), and at the coupler 20 a Gaussian mode of this channel is imposed on the other channel (beam $B_2$), and coherent addition of the two beams' distributions is thus achieved. The operation of this resonator cavity can be understood by considering the losses to various transverse modes in the aperture-less channel (beam $B_2$). All of the transverse modes, except for the mode present in the other channel $B_1$, will suffer considerable losses at the intra-cavity coupler 20, and, if the gain is not too high, these modes will not lase. On the other hand, the common mode for the two channels will suffer no losses and will coherently add. Thus, both the imposing of the modal distribution content and the coherent addition are achieved.

Figure 11:
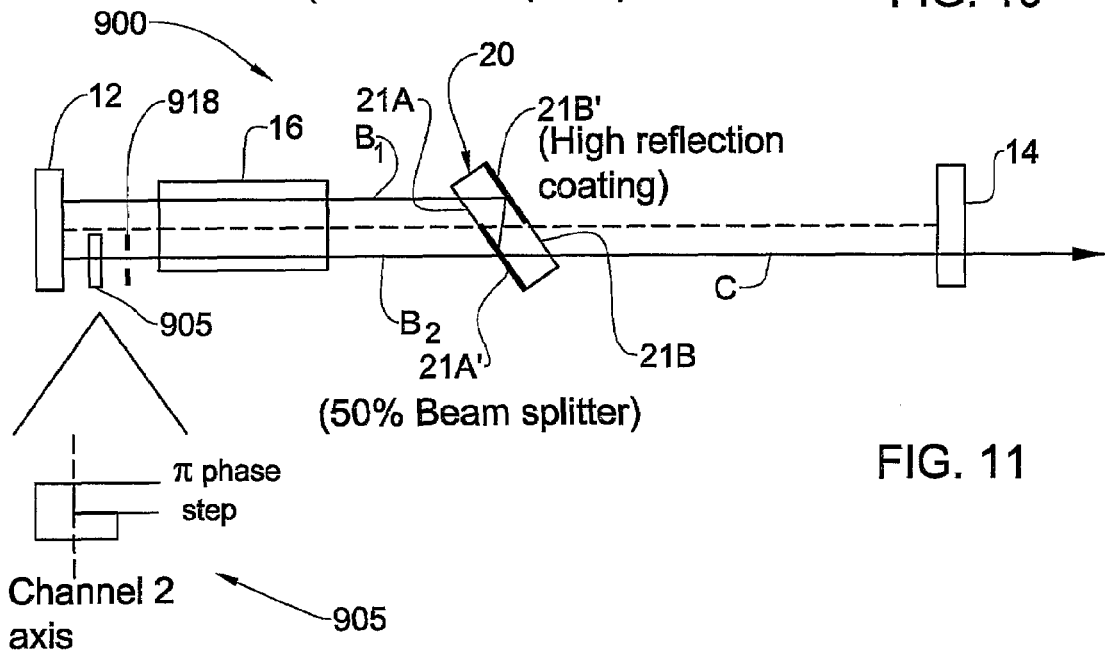
FIG. 11 schematically illustrates the embodiment of the invention, where one channel imposes a single high-order transverse mode on the other channel and coherent addition of the two high order mode distributions is achieved using a single interferometric coupler.

FIG. 11 illustrates the case when a single high-order mode is desired at the output, and thus a single aperture and a single phase element are required in only one of the channels. A resonator cavity 900 is shown differing from that of FIG. 10 in that the single-aperture arrangement 918 and a phase element 905, configured to create a $\pi$-phase step, are located in one channel/beam $B_2$. Hence, one channel imposes a single high-order transverse mode on the other channel, and coherent addition of the two high order mode distributions is achieved using the single interferometric coupler 20. It should be noted that the aperture and/or the phase element may be positioned in either one of the channels (including the output combined channel).

Figure 12:
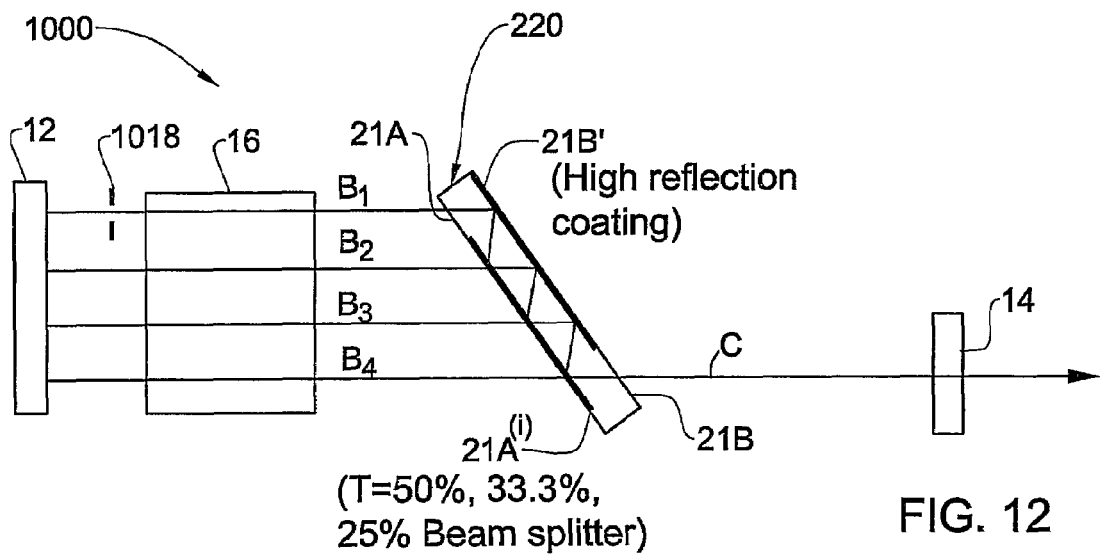
FIG. 12 schematically illustrates the embodiment of the invention, where one channel imposes a specific multimode content on the other channels and sequential coherent addition of the four beams is achieved using a single interferometric coupler.

FIG. 12 exemplifies the case when obtaining a specific multimode beam (say with $M^2$=3) at the output is desired. A resonator cavity 1000 includes a back mirror 12; an output coupler 14; a gain medium 16; and a planar interferometric beam coupler 220 (configured as described above with reference to FIGS. 3 and 4); and a single-aperture arrangement 1018 in optical path of one of four laser beams $B_1$-$B_4$-beam $B_1$ in the present example. The beam coupler 220 is appropriately patterned with coatings: a highly reflective coating on its rear facet, and 50%, 33.3, and 25% beam splitting coatings on its front facet. Here, the single suitable aperture 1018 is provided in one of the channels, and thus one channel imposes a specific multimode content on the other channels, and the use of the single interferometric coupler 220 provides sequential coherent addition of the four beams.

It should be noted that a resonator cavity of the present invention may utilize two interferometric plates with multiple coatings, similar to those of FIGS. 3, 4 and 12, to generate two-dimensional arrays of beams. This can be implemented by orienting one plate at a certain vertical tilt angle with respect to a plane perpendicular to the cavity axis thus accounting for coherent addition in the vertical direction, while orienting the second plate at a certain horizontal tilt angle with respect to said perpendicular plane and accounting for coherent addition in the horizontal direction. This results in coherent addition of large arrays (3×3, 4×4, 5×5, 6×6, etc.) with the use of only two multiple-coating interferometric plates. An example of such configuration will be described further below with reference to FIG. 17B.

Figure 13:
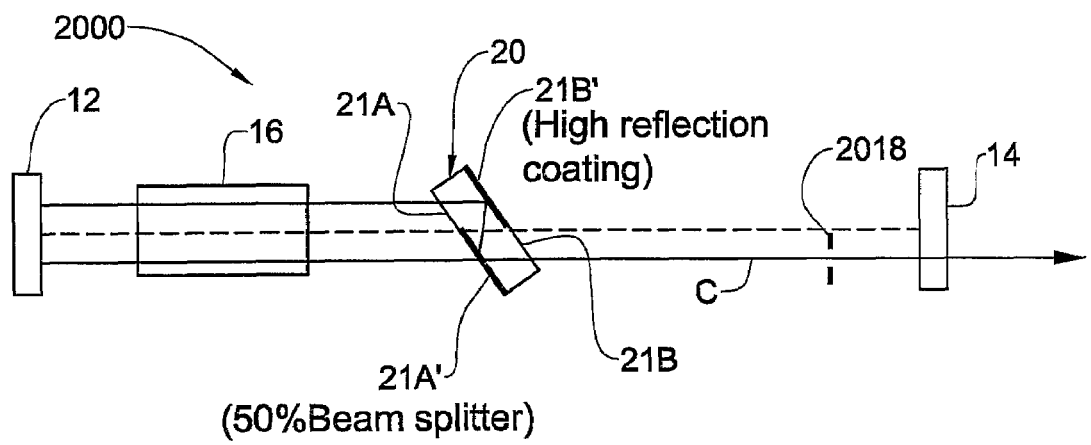
FIG. 13 schematically illustrates the embodiment of the invention, where the common channel imposes Gaussian mode content on the two channels and coherent addition of the two beams is achieved using a single interferometric coupler.

FIG. 13 shows a resonator cavity 2000 including a back mirror 12, an output coupler 14, a gain medium 16, a beam coupler assembly including a planar two-beam interferometric coupler 20; and a single-aperture 2018 located in the common (combined) channel C. Using only a single aperture in the common channel, where the two or more channels coincide, introduces losses to the common multimode beam at the output of the coupler 20, so that only the desired Gaussian or multimode beam (depending on the aperture diameter) will lase. If a single high-order mode operation is desired, then also a single phase element or other mode selecting element in one of the channels or in the combined channel is needed, in which case only a specific single high-order mode beam will lase.

It should be noted that all the above-described configurations provide for achieving intra-cavity phase locking of laser beams, because in order to coherently add beams they must be phase locked. With all the above configurations it is possible to use a highly reflective mirror as the output coupler 14 and change the back mirrors 12 by output couplers, and thus obtain several phase locked beams at the output. The above-described configurations involve strong coupling between the channels, which might be undesired with low gain lasers.

Figure 14:
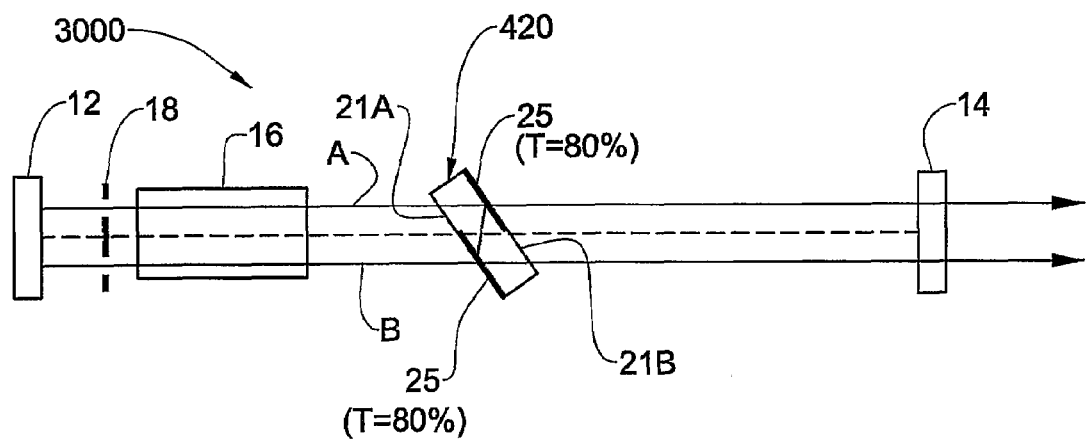

The present invention provides for intra-cavity phase locking of laser beams with "weak" couplers. Referring to FIG. 14, there is illustrated a resonator cavity 3000 configured for intra-cavity phase locking of two laser beams with a phase locking beam coupler assembly. The device 3000 includes a back mirror 12, an output coupler 14, a gain medium 16, a double-aperture arrangement 18, and a phase locking interferometric coupler 420. This coupler 420 is related to the above-described couplers, but is used here to perform only the phase locking and not the coherent addition of the beams into a single output beam. The coupler 420 is generally similar to the coupler of FIG. 1 (planar interferometric two-beam coupler), but distinguishes therefrom in that a high reflection coating (21B' in FIG. 1) and a 50% beam splitter coating (21A' in FIG. 1) are both replaced by partially transmitting coatings 25. The coating 25 may, for example, be of 80% transmission. In case of different intensities of input beams A and B, different appropriate transmission values should be chosen for the two coatings. If the two input beams A and B are not phase coupled (random relative phase), then each beam will suffer about 30% loss at the coupler 420 in a double pass, namely, traveling once through the coupler 420 and then back again through the coupler 420. But if the input beams A and B are phase coupled, such that the two beams add up coherently on the coupler 420 (forward and back), then the losses for both beams at the coupler are negligible.

Thus, in the configuration of FIG. 14, the two beams are transmitted through the coupler 420. If they are in phase, then in one direction the first channel will pass off power to the second channel (coherent addition at the second beam splitter), while in the reverse direction the second channel will pass off power back to the first channel (coherent addition on the first beam splitter). So, the coupler is sort of a directional tap, enabling exchange of power between the channels.

Figure 15:
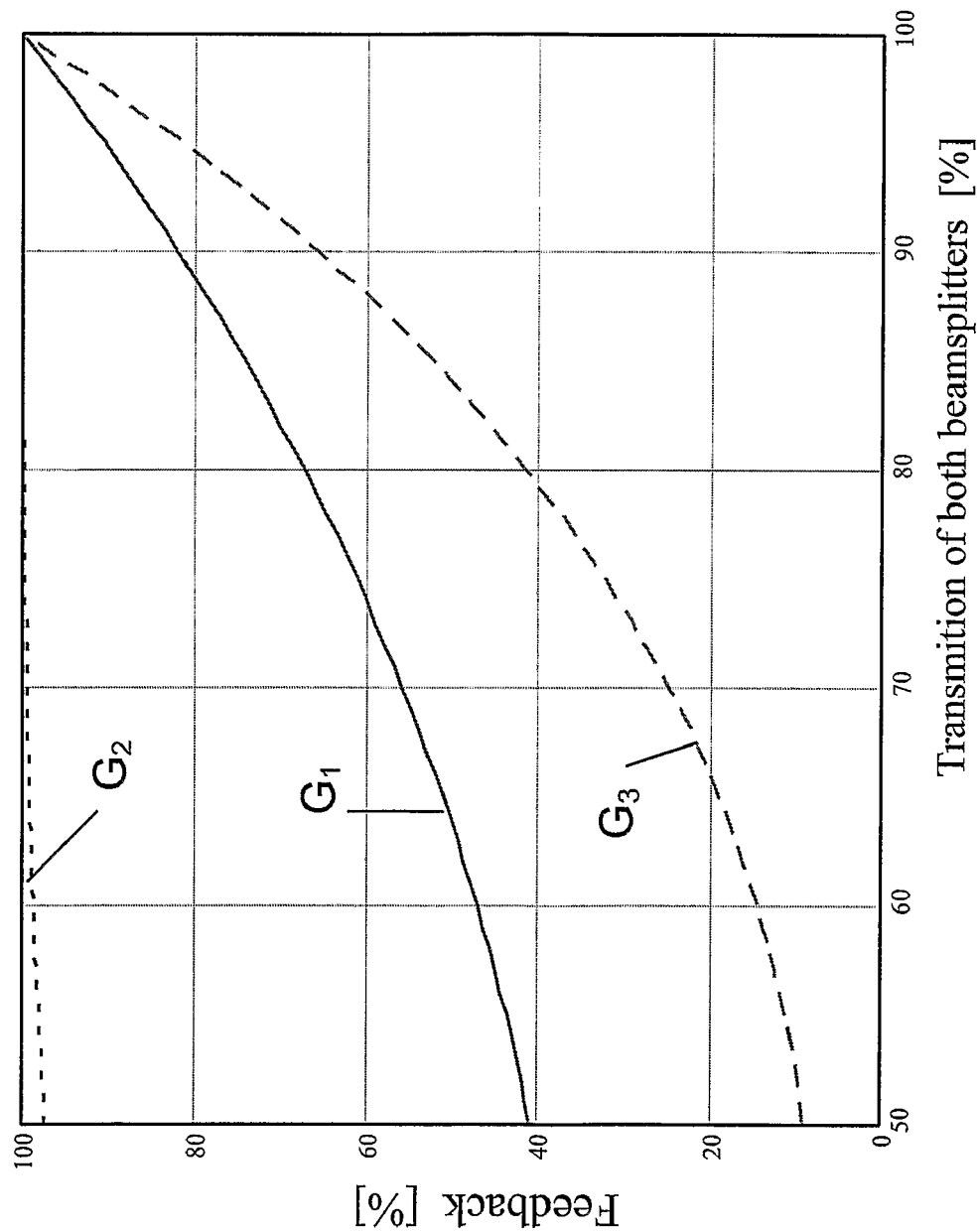

Considering the interferometric coupler 420 and the output coupler 14 with R=1 as one feedback mechanism into the laser, then the feedback versus the transmission of the beam splitters on the interferometric coupler is as illustrated in FIG. 15. These are calculation results for the feedback after a double pass through the coupler 420, assuming a 100% reflectivity mirror placed at the output of the coupler. Three graphs $G_1$-$G_3$ are shown, corresponding to, respectively, incoherent summation of the beams, and positive and negative coherent summation of the beams. It is thus evident that, with the correctly chosen conditions, even a small coupling percentage (i.e., low reflection percentage) is sufficient to produce big discrimination between the positive coherent summation and the incoherent summation. It should be noted that choosing slightly different transmissions for the beam splitters could further reduce the losses for the positive coherent summation case.

It can be seen that when the beams are in phase, even with strong couplers (transmission<80%) the feedback is high and the losses at the coupler are insignificant. On the other hand, if the beams are not phase locked and have a random relative phase, then the feedback is much lower, and the losses at the coupler are severe (even with T=95%). In this configuration and with more than a few percentage of coupling the laser will "chose" to operate so that the beams will be phase locked. This will occur only if there is at least one common frequency (longitudinal mode) to both laser channels (it might be necessary to insert additional passive/active optical elements, such as delay plates that can be actively tilted, into the channels to introduce appropriate phase/path delays).

Figure 16A:
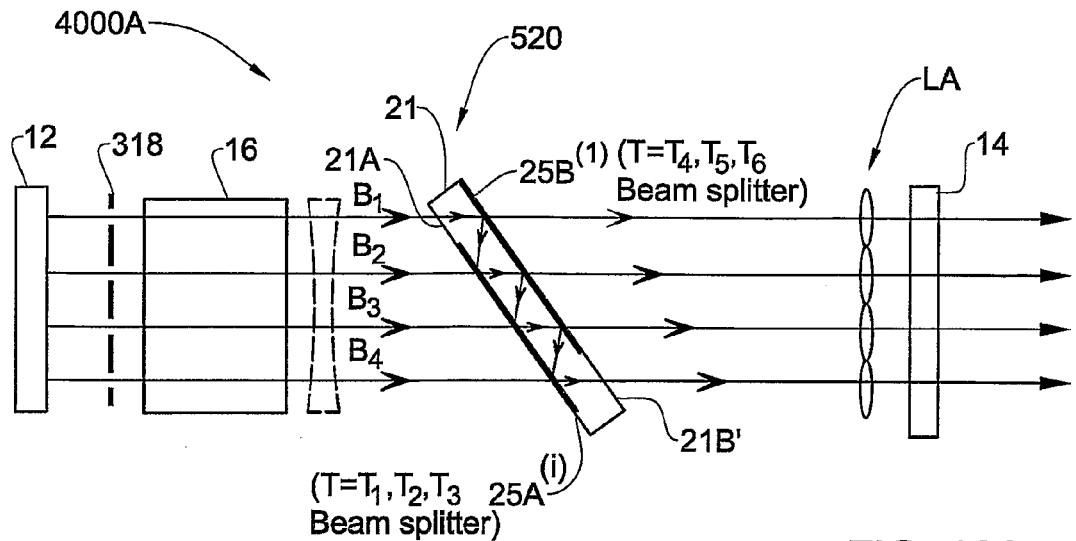
FIG. 16A shows intra-cavity phase locking of four Gaussian beam distributions using a single interferometric weak coupler.

FIG. 16A schematically illustrates how weak coupling can be created between more than two channels by using a sequential coupler generally similar to that of FIG. 14, but with different coatings. A resonator cavity 4000A is shown including a back mirror 12, an output coupler 14, a gain medium 16, a multi-aperture arrangement 318, and a sequential interferometric coupler 520. The coupler 520 is a plane parallel plate 21 with different partially transmitting coatings on its front and rear facets. More specifically, the front facet has a substantially transmitting region 21A and (N−1) different partially transmitting (beam splitting) regions, generally at $25A^{(i)}$, three such regions being shown in the present example of, respectively $T_1$, $T_2$ and $T_3$ transmissions (considering four light channels, i.e. N=4). The rear facet has a substantially transmitting region 21B', and a region formed by (N−1) different beam splitting sub-regions (N=4 in the present example) of, respectively $T_4$, $T_5$ and $T_6$ transmissions. All the beams $B_1$-$B_4$ are transmitted through the coupler 520, each giving away or receiving some coupling power to the other channels. The necessary transmissions, so as to maximize the feedback (homogeneously among the channels) and minimize the losses at the coupler, can be calculated for the case when all beams are in phase and coherently add at the coupler 520. Here, at least one mutual longitudinal mode for all possible channels should exist so that coherent addition can take place (additional passive/active optical elements, such as delay plates that can be actively tilted, that introduce appropriate phase/path delays could be used). Under these conditions, the laser will automatically operate such that all beams are phase locked. It should be noted that it is possible to interchange the back mirror and the output coupler so that the output phase locked beams are to the left.

As also shown in the figure, the above-described resonator cavity 4000A optionally includes a lens arrangement LA. This may be an array of small lenses (lenslets) arranged such that each channel is associated with its corresponding lens. Such an effect of adding curvature to the basic single channel resonator enables better transverse mode selection and less sensitivity to thermal lensing in the gain medium. It should be noted, although not specifically shown, that alternatively or additionally, the output coupler (mirror) 14 may be configured as an array of concave output couplers.

Generally, in order to reduce the effect of thermal lensing on the combining efficiency, when partially or fully coherently adding channels in the same gain medium, the beam coupler assembly could be positioned near the waist of the beam in the cavity (the waist can be designed to be within the cavity by adding intra-cavity mirrors of changing curvature). Alternatively or additionally, an intra-cavity lens (negative) could be used near the gain medium (as exemplified in the configuration of FIG. 16A, being shown dashed curves) in order to reduce the positive thermal lensing effect of the gain medium.

It should also be noted that, for practical implementation, the transmissions at the front and back surfaces of the interferometric coupler 520 could be chosen to be uniform (for example 80% transmission), which provides for a very simple device fabrication procedure, although resulting in some energy loss.

Additionally, it should be noted that when operating with a single large gain medium and an interferometric plate with uniform coatings (as exemplified in FIG. 16A), the phase locking can also be achieved without any aperture. In this case, definite channels are not formed within the resonator, but instead a single large "supermode" distribution with a defined phase is formed at the output. When the thickness of the interferometric plate is designed adequately, this supermode has a uniform phase and could roughly resemble a very large Gaussian. This could be useful for obtaining an output beam with high power and good beam quality.

It should also be noted that intra-cavity phase locking can be obtained by using a coupler based on specially designed gratings. This is illustrated in FIGS. 16B and 16C.

Figure 16B:
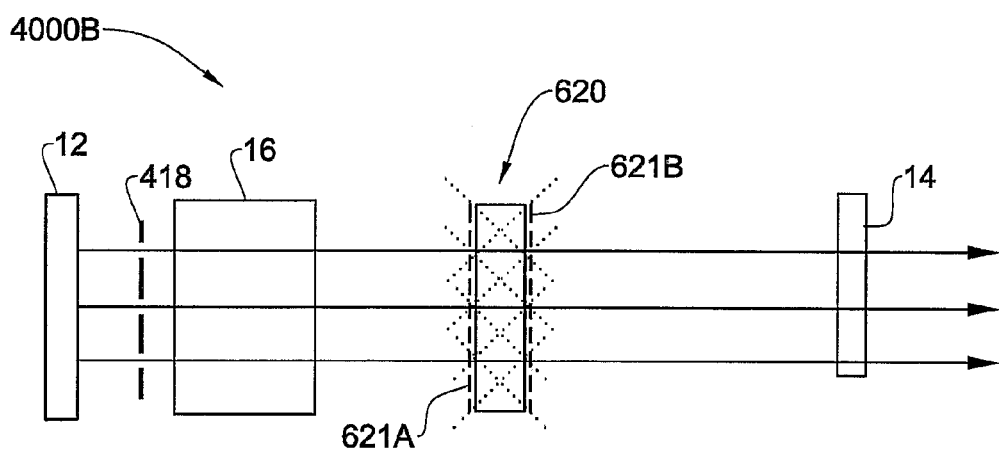
FIGS. 16B and 16C show intra-cavity phase locking using a grating-based coupler.
Figure 16C:
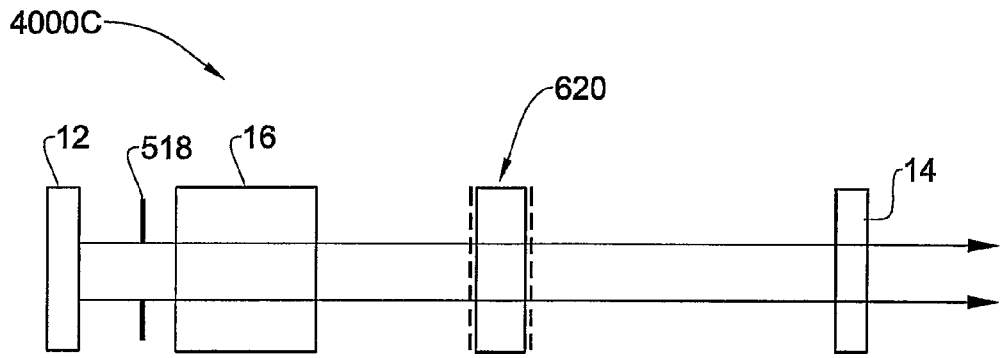

FIG. 16B exemplifies a resonator cavity 4000B configured for phase locking three discrete channels using three spaced-apart apertures. The device 4000B thus includes a back mirror 12, an output coupler 14, a gain medium 16, a grating-based coupler 620, and an aperture arrangement 418 defining three apertures. Here, the apertures serve for forming the spatially separated channels. Also, the aperture' diameter defines the transverse mode content in each channel. The coupler 620 is configured as a plane parallel plate with its front and rear facets having patterned regions (surface relief) presenting two specially designed gratings 621A and 621B.

Light incident on the first grating 621A is split into light portions of various diffraction orders, and these light portions propagate inside the plate towards the second grating 621B. The spacing between the adjacent apertures, the thickness of the coupler plate, and the pattern features' dimensions of the gratings, are designed such that light from neighboring channels constructively and destructively interfere at the second grating, thus coupling these channels. In the figure, doted lines coming out of the coupler 620 indicate light paths where the destructive interference occurs between different diffraction orders of the neighboring channels. Constructive interference between neighboring channels occurs only along the original channel paths designated by solid lines.

The gratings should preferably be designed such that most of the energy is distributed between the 0, +1, −1 orders, with low energy in higher diffraction orders. The exact distribution of energy between the 0 order and the +1, −1 orders determines the coupling strength of the coupler.

In order to minimize losses, the resonator cavity self-phase-locks such that constructive interference occurs at the second grating in the original channels and all other diffraction orders destructively interfere. This results in phase locking of the three discrete laser channels.

FIG. 16C exemplifies a resonator cavity 4000C, configured generally similar to cavity 4000B, but distinguishing therefrom in that three apertures of the previous example are replaced by a single large aperture 518. In this case, no distinct light channels are formed, and continuously the field at each point is coupled to the fields at other points in the beam. This spatial coupling across the large beam introduced by a grating coupler 620 results in a single large coherent distribution with well define amplitude and phase distribution. Thus, a large beam distribution with high power and potentially good beam quality can be obtained at the output.

Another problem solved by the present invention is associated with the fact that in a large-aperture multimode resonator cavity, the output power is high (large mode volume), but the beam quality is relatively poor (high $M^2$). The present invention provides for improving the beam quality of multimode laser resonators by modifying the resonator such that instead of using one highly multimode beam distribution in the gain medium, an array of Gaussian beam distributions is used, which beams are phase-locked and coherently added within the resonator, to obtain a single Gaussian output beam. As a result, the output power is lower than with the standard multimode configuration due to the fill factor of the Gaussian distributions, but the beam quality improves significantly. This conversion from a multimode beam distribution to a Gaussian distribution is done with relatively high efficiency.

Figure 17A:
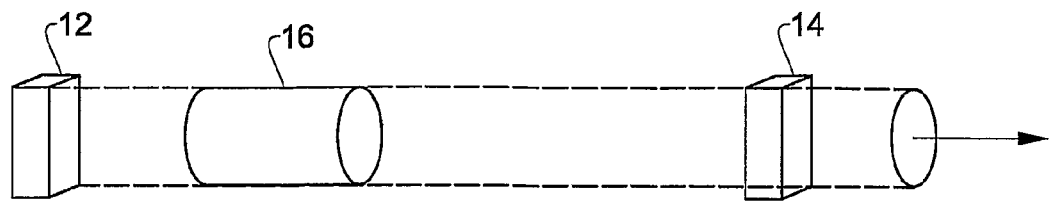
Figure 17B:
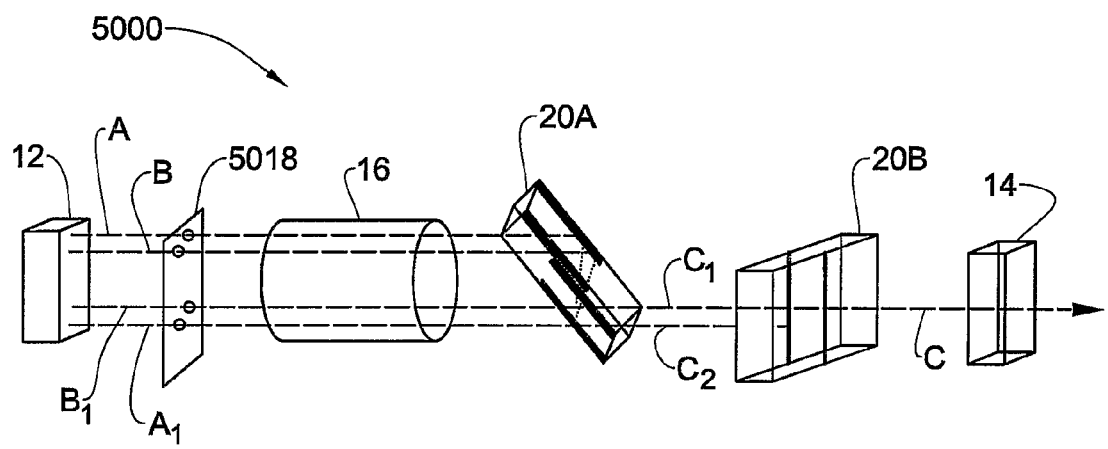

Reference is made to FIGS. 17A and 17B illustrating how an array of four Gaussian beam distributions replaces a corresponding multimode beam distribution.

FIG. 17A shows schematically a standard multimode resonator including a back mirror 12, an output coupler 14, and a gain medium 16 (laser rod) therebetween.

FIG. 17B shows a resonator configuration 5000 of the present invention including a back mirror 12, an output coupler 14, a gain medium 16 of the multimode resonator, a specially designed aperture arrangement 5018, and a beam coupler assembly including two interferometric couplers 20A and 20B. In the present example of FIG. 17B, the aperture arrangement 5018 is designed as a multiple-aperture configuration including four apertures, each with a diameter suitable for Gaussian mode operation. It should, however, be noted that a similar effect can be achieved by using a single rectangular-shaped aperture configuration (e.g., square aperture for the case of two pairs of beams). It should be understood that for a given resonator, i.e. length and mirror curvatures, the aperture size preferably corresponds to four tightly packed channels. One coupler 20A is designed and oriented so that it combines one pair of horizontally displaced Gaussian distributions A and B with another pair of horizontally displaced Gaussian distributions A' and B', resulting in two Gaussian distributions $C_1$ and $C_2$ (instead of four) that are horizontally displaced with respect to each other. The other coupler 20B is oriented so that it combines these two Gaussian distributions $C_1$ and $C_2$ into one Gaussian distribution C. As indicated above, the laser will tend to operate in the minimal loss state, where all the beams phase lock and add up coherently, provided that there is at least one common longitudinal mode (frequency) for all four channels. This could be achieved by inserting additional optical elements into the channels to obtain the appropriate optical path lengths.

The multiple-aperture arrangement 5018 in the optical path of input beams may be replaced by a single aperture in the common path C as shown in the figure in dashed lines.

As indicated above, yet another option is to use a single square aperture in the optical path of input beams. In this case, the thickness of the interferometric plates 20A and 20B and the resonator mirrors 12 and 14 are appropriately designed such that four Gaussian or multimode beam distributions are "tightly packed" within the gain medium 16 and coherently added.

It should be understood that the configuration of FIG. 17B could be easily scaled to larger arrays by using additional pairs of interferometric plates. For example, for 16 Gaussian distributions (4×4 array) four interferometric couplers are used, and special care is taken to fulfill the common longitudinal mode requirement. Generally speaking, if the common frequency requirement is fulfilled, this scheme can be extended even further. It should also be noted that the example of FIG. 17B, using an array of Gaussian beams and intra-cavity interferometric couplers, could be extended to other configurations where an array of low order multimode beam distributions and other types of couplers (as described above) are used. Considering the use of a single square aperture at the input beams path, and 4×4 array output, two pairs of interferometric plates with different thicknesses are used, where the thickness of the plates in the first pair is twice the thickness of the plates in the second pair.

Figure 18:
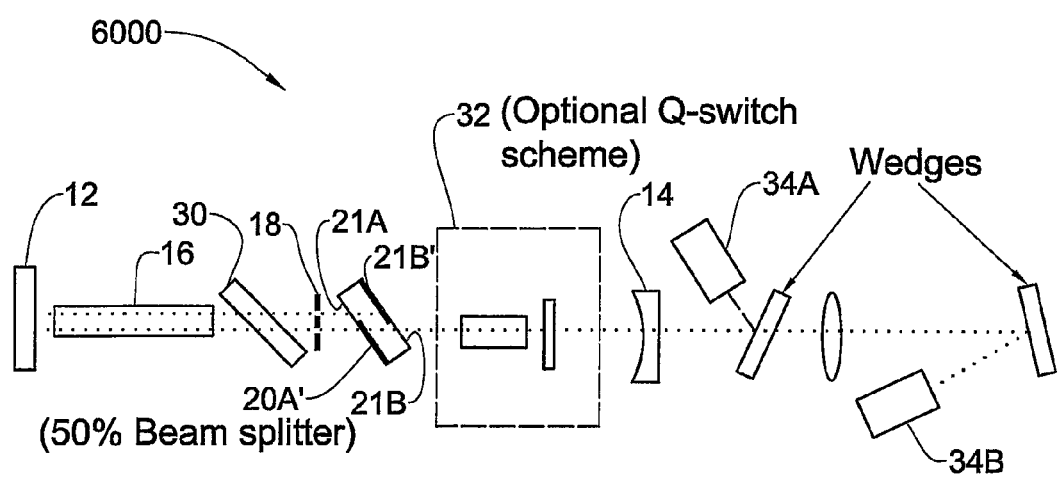
FIG. 18 schematically illustrates a possible pulsed Nd:YAG laser experimental setup used for intra-cavity coherent addition of two Gaussian beam distributions.

A possible Nd:YAG laser experimental setup is shown in FIG. 18 and generally designated 6000. The resonator is basically about 70 cm long plano-concave resonator, with a concave (R=3 m) output coupler 14 of 40% reflectivity at 1064 nm and a high-reflective flat mirror 12. An (A) Nd:YAG rod 16 of 5 mm diameter and 10 cm length, with 1.1% doping, is placed in a diffusive ceramic pump chamber. The resonator includes a double aperture 18 with two apertures of 1.6 mm diameter each, positioned 2.4 mm apart (between centers), and a high quality thin film polarizer 30. In general a polarizer is not needed, however in order to obtain high accuracy in the coatings transmission and to exploit Brewster angle instead of AR coating, a single polarization state is preferable. The 3 mm thick interferometric coupler 20 is positioned at Brewster's angle. Half of its first (front) facet is coated with a 50% beam splitter coating 21A', and half of its second (rear) facet is coated with a high reflective coating 21B' (no AR coatings). An optional arrangement 32 comprised of an electro-optical LiNbO3 crystal and a λ4 retardation plate can be used for Q-switching. CCD cameras (near filed camera and far field camera) 34A and 34B and Spiricon Laser Beam Analyzers are used for detecting and characterizing the near and far field intensity distributions.

Thus, the present invention provides novel resonator cavity configurations, as well as couplers to be used therein, for achieving intra-cavity phase locking, or phase locking and coherent addition, of two or more Gaussian beams, two or more single-high-order-transverse-mode beams, and two or more transverse multimode beams. The technique of present invention provides for imposing the modal distribution content of one channel on all other channels within the laser resonator cavity, and coherently combining all these distributions to obtain a single powerful beam at the output, with the desired modal content.

The technique of the present invention provides for designing compact, stable and practical laser systems whose outputs will have both high power and high beam quality, much above those from single channel high power lasers. The compactness of the single-substrate coupler enables the combined lasers to "share" optical components such as the end resonator mirrors. This further improves the stability of the combined system, as vibrational and thermal noises are largely common-mode-rejected. The flexibility to design and fabricate complex elements on a single substrate enables control of the coupling strength so as to optimize the trade off between coupling and loss (for high-gain lasers strong coupling between the lasers in required for phase locking, whereas for low-gain lasers weak coupling is better). In the technique of the present invention, external polarization manipulation can be used as an additional degree of control. Indeed, the use of orthogonal polarizations for two lasers will enable efficient addition even without interferometric stability. Slightly different wavelengths may also be used for the same purpose. The couplers can be designed to combine lasers operating with higher order modes, and even multimode beams, enabling even higher total powers than with lasers operating with the single fundamental mode. Single-substrate optical elements can be mass produced, and offer substantial savings in manufacturing, assembling and combining of many individual lasers.

The technique of the present invention can be applied to a wide variety of lasers (gas, solid state, diode, fiber, microdisk, etc), a variety of stable resonators, and various modes of operation (CW, pulsed, etc), which could be used in industrial, medical, and military applications.

Those skilled in the art will readily appreciate that various modifications and changes can be applied to the embodiments of the invention as hereinbefore described without departing from its scope define in and by the appended claims.

The invention claimed is:

1. A resonator cavity comprising at least one gain medium and end reflectors which define together longitudinal modes of light in the cavity, the cavity further comprising an intra-cavity beam coupler assembly configured to split light impinging thereon into a predetermined number of spatially separated light channels, and to cause phase locking and at least partial coherent combining of the light channels, which have common longitudinal and transverse modes, in a double pass through the beam coupler assembly, the resonator cavity being configured and operable to produce at least one output combined light channel of a predetermined intensity profile.

2. The resonator cavity of claim 1, wherein the light channels are associated with a single gain medium.

3. The resonator cavity of claim 1, wherein the beam coupler assembly is configured as an interferometric coupler assembly.

4. The resonator cavity of claim 3, wherein the interferometric coupler assembly comprises a plane parallel plate, each of front and rear facets of the plate having a predetermined pattern formed by regions of predetermined transmission or reflectivity, said plane parallel plate having a predetermined thickness d and being oriented with respect to a light propagation cavity axis at a predetermined angle defining a certain angle α of light incidence onto the plate so as to ensure said splitting and said at least partial coherent combining of the light channels in the double pass through the plate.

5. The resonator cavity of claim 4, wherein for the incident angle α, the thickness d of the plate is determined as:

$$d = x_0 / \{2 \cos \alpha \, tg[\arcsin(\sin \alpha / n)]\}$$

wherein $x_0$ is a distance between propagation axes of the light channels, and n is a refractive index of a material of the plate, thereby providing for matching the distance between the light channels so as to enable an optimal overlap between the light channels and their parallel propagation after exiting the beam coupler assembly.

6. The resonator cavity of claim 3, wherein the beam coupling assembly is configured to provide for phase locking and partial coherent combining of the light, the output being in the form of a single large mode intensity profile with a well defined phase.

7. The resonator cavity of claim 5, wherein each of the front and rear facets of the plate has the predetermined pattern formed by regions of predetermined uniform transmission or reflectivity.

8. The resonator cavity of claim 7, wherein the front facet includes a substantially transmitting region and a region of the predetermined partially light transmitting property, and the rear facet includes a region of said predetermined partially light transmitting property and a substantially transmitting region, the dimensions of the regions on the front and rear facets and the orientation of the plane parallel plate being such as to allow light passage through the plate to the partially transmitting region on the rear facet, where light is reflected from said partially transmitting region of the rear facet towards the partially transmitting region of the front facet, which reflects light to the transmitting region on the rear facet.

9. The resonator cavity of claim 8, wherein said end reflectors comprise an output end reflector accommodated in an optical path of light emerging from the rear facet.

10. The resonator cavity of claim 1, comprising an intra-cavity aperture arrangement configured to select, in at least one light channel, a predetermined transverse mode content corresponding to said predetermined intensity profile.

11. The resonator cavity of claim 10, wherein the aperture arrangement has one of the following configurations: (a) comprises multiple apertures each associated with the respective one of said light channels propagating between the rear end reflector and the beam coupler assembly; (b) comprises a single aperture associated either with one of the light channels propagating between the rear end reflector and the beam coupler assembly or with one combined channel propagating between the beam coupler assembly and the output end reflector; and (c) comprises a large aperture associated with all the light channels propagating between the rear end reflector and the beam coupler assembly.

12. The resonator cavity of claim 10, wherein the beam coupling assembly is configured to provide coherent combining of the light channels to produce a single output combined channel.

13. The resonator cavity of claim 12, wherein the beam coupler assembly includes at least one simple beam splitter/combiner.

14. The resonator cavity of claim 12, comprising N gain media producing N light channels, respectively, said beam coupler assembly including (N−1) simple beam splitter/combiners.

15. The resonator cavity of claim 10, wherein the beam coupler assembly is configured as an interferometric coupler assembly.

16. The resonator cavity of claim 15, wherein the interferometric coupler assembly comprises a plane parallel plate, each of front and rear facets of the plate having a predetermined pattern formed by regions of predetermined transmission or reflectivity, the plane parallel plate having a predetermined thickness d and being oriented with respect to a light propagation cavity axis at a predetermined angle defining a certain angle $\alpha$ of light incidence onto the plate so as to ensure said splitting and said at least partial coherent combining of the light channels in the double pass through the plate.

17. The resonator cavity of claim 16, wherein for the incident angle $\alpha$, the thickness d of the plate is determined as:

$$d = x_0 / \{2 \cos \alpha \, tg[\arcsin(\sin \alpha/n)]\}$$

wherein $x_0$ is a distance between propagation axes of the light channels, and n is a refractive index of a material of the plate, thereby providing for matching the distance between the light channels so as to enable an optimal overlap between the light channels and their collinear propagation after exiting the beam coupler assembly.

18. The resonator cavity of claim 16, wherein the front facet includes a substantially light transmitting region, and a region formed by (N−1) different beam splitting sub-regions for N light channels, respectively, each i-th beam splitting sub-region, i=2, . . . N, having a reflectivity of (1-1/i) or transmittance of 1/i, such that a first light channel is substantially not affected by the front facet and the other (N−1) light channels are differently affected by said (N−1) beam splitting regions, respectively; and the rear facet includes a relatively large highly reflective region and a substantially light transmitting region, the dimensions of the regions on the front and rear facets and the orientation of the plane parallel plate being such as to allow light passage through the front facet to the highly reflective region of the rear facet where light is reflected towards the beam splitting region in a front surface where it is partly reflected back to the highly reflective region on the rear facet.

19. The resonator cavity of claim 18, wherein said end reflectors comprise an output end reflector accommodated in an optical path of light emerging from the rear facet.

20. The resonator cavity of claim 18, wherein the beam coupling assembly is configured to provide full coherent combining of the light channels to produce a single output combined channel, the output end reflector being accommodated in an optical path of light coming from the front facet.

21. The resonator cavity of claim 16, wherein the said end reflectors comprise an output end reflector is accommodated in an optical path of a light portion that is reflected from the front facet;
the front facet includes a region formed by (N−1) different beam splitting sub-regions for N light channels, respectively, each i-th beam splitting sub-region, i=2, . . . N, having a reflectivity of (1-1/i) or transmittance of 1/i, said region of (N−1) sub-regions being surrounded by substantially light transmitting regions, such that a first light channel is substantially not affected by the front facet and the other (N−1) light channels are differently affected by said (N−1) beam splitting regions, respectively; and the rear facet is highly reflective, the dimensions of the regions on the front facets and the orientation of the plane parallel plate being such as to allow light passage through the front facet to the highly reflective rear facet where light is reflected towards the beam splitting sub-region in a front surface where it is partly reflected back to the highly reflective rear facet which reflects light to pass through the substantially light transmitting region on the front facet towards the output end reflector.

22. The resonator cavity of claim 21, wherein the substantially transmitting regions are formed by an anti-reflecting coating on the plate.

23. The resonator cavity of claim 15, wherein the beam coupler assembly is oriented at a Brewster angle with respect to the cavity axis, and the input light has specific linear polarization.

24. The resonator cavity of claim 16, wherein the front facet of the plane parallel plate comprises a single beam splitting sub-region, thereby producing two light channels.

25. The resonator cavity of claim 11, wherein said single aperture has a diameter capable of carrying out one of the following: (i) selecting the lowest transverse $TEM_{00}$ mode distribution, thereby enabling to impose this mode of said one light channel on one or more other light channels and the coherent combining of all the light channels by the beam coupler assembly; (ii) selecting a desired multiple-transverse-mode distribution, thereby enabling to impose the desired multiple-transverse-mode distribution of said one light channel on one or more other light channels and the coherent combining of all the light channels by the beam coupler assembly; and (iii) selecting a desired single high-order transverse mode distribution, thereby enabling to impose the single high-order transverse-mode distribution of said one light channel on one or more other light channels and the coherent combining of all the light channels by the beam coupler assembly, the cavity further comprising a phase element.

26. The resonator cavity of claim 25, wherein said one light channel is the output combined light channel.

27. The resonator cavity of claim 11, wherein each of the apertures has a diameter capable of carrying out at least one of the following: (i) selecting the lowest transverse TEM00 mode distribution; (ii) selecting a desired multiple-transverse-mode distribution; and (iii) selecting a desired single high-order transverse mode distribution.

28. A resonator cavity comprising at least one gain medium and end reflectors which define together longitudinal modes of light in the cavity, the resonator cavity further comprising:
(a) a beam coupler assembly configured to split light impinging thereon into a predetermined number of spatially separated light channels, and to cause phase locking and at least partial coherent combining of the light channels, having common longitudinal and transverse modes, in a double pass through the beam coupler assembly, to thereby produce at least one output combined light channel; and
(b) an aperture arrangement configured to select in at least one of the light channels, a predetermined transverse mode content that is desired at the cavity output.

29. A beam coupler element for controlling light propagating through a resonator cavity to provide an output light channel in the form of coherent addition of at least two light channels having common longitudinal modes, the beam coupler assembly comprising a plane parallel plate with its front and rear facets being patterned to have regions of predetermined transmission or reflectivities, wherein: the front facet includes a substantially transmitting region and (N−1) beam splitting regions for N light channels, respectively, each i-th beam splitting region, i=2, . . . N, having a reflectivity of (1−1/i) or transmittance of 1/i, such that a first light channel is substantially not affected by the front facet and the other (N−1) light channels are differently affected by the (N−1) beam splitting regions, respectively; the rear facet includes a highly reflective region; and dimensions of said regions of the front and rear facet and orientation of the plane parallel plate with respect to the light channels' propagation axis are such that light is repetitively reflected back and forth between the highly reflective region and the beam splitting region.

30. A beam coupler element for controlling light propagating through a resonator cavity to provide at least two phase locked output light channels of desired transverse and longitudinal modes, the beam coupler assembly comprising: a plane parallel plate with its front and rear facets being patterned to have regions of predetermined transmission and reflectivity, wherein: the front facet includes a substantially transmitting region and at least one predetermined beam splitting region; the rear facet includes at least one predetermined beam splitting region; and dimensions of said regions of the front and rear facets and orientation of the plane parallel plate with respect to the light channels' propagation axis are such that light enters the beam coupling element through said regions of the front facet and is reflected from the beam splitting region of the rear facet towards the beam splitting region of the front facet and back to the beam splitting region of the rear facet.

* * * * *